(12) United States Patent
Sato et al.

(10) Patent No.: US 9,398,273 B2
(45) Date of Patent: Jul. 19, 2016

(54) IMAGING SYSTEM, IMAGING APPARATUS, AND IMAGING METHOD

(71) Applicant: Panasonic Intellectual Property Management Co., Ltd., Osaka (JP)

(72) Inventors: Satoshi Sato, Kyoto (JP); Takeo Azuma, Kyoto (JP); Kunio Nobori, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/685,855

(22) Filed: Apr. 14, 2015

(65) Prior Publication Data

US 2015/0312503 A1    Oct. 29, 2015

(30) Foreign Application Priority Data

Apr. 25, 2014  (JP) .................................. 2014-091167
Nov. 25, 2014  (JP) .................................. 2014-237776

(51) Int. Cl.
| | |
|---|---|
| H04N 3/14 | (2006.01) |
| H04N 5/335 | (2011.01) |
| H04N 9/04 | (2006.01) |
| H04N 5/374 | (2011.01) |
| H03M 7/30 | (2006.01) |

(52) U.S. Cl.
CPC ............. *H04N 9/045* (2013.01); *H03M 7/3062* (2013.01); *H04N 5/374* (2013.01)

(58) Field of Classification Search
CPC ...... H04N 9/045; H04N 5/374; H03M 7/3062
USPC ....................... 348/222.1, 272–276
See application file for complete search history.

(56) References Cited

U.S. PATENT DOCUMENTS

| | | | | |
|---|---|---|---|---|
| 4,663,655 | A * | 5/1987 | Freeman ................ | H04N 9/646 348/242 |
| 2005/0052552 | A1 * | 3/2005 | Hashimoto ............ | H04N 9/045 348/272 |

OTHER PUBLICATIONS

J. Zhang et al., "Compressed Sensing Recovery via Collaborative Sparsity", Proc. of Data Compression Conference, pp. 287-296, 2012.

(Continued)

*Primary Examiner* — Yogesh Aggarwal
(74) *Attorney, Agent, or Firm* — Wenderoth, Lind & Ponack, L.L.P.

(57) ABSTRACT

An imaging system includes an encoding apparatus that performs a multiple sampling process on charge signals in a plurality of wavelength bands and encodes image information and a decoding apparatus that decodes the image information. In the multiple sampling process, the charge signals of pixels in a pixel group having a predetermined arrangement pattern are analog-summed and the sum is converted into a new digital signal. The encoding apparatus performs the multiple sampling process on charge signals in at least two of the wavelength bands and outputs a digital image signal in each of the wavelength band. The at least two pixel groups have different arrangement patterns, and combinations of the arrangement patterns for all the wavelength bands differ from one another. The decoding apparatus generates a reconstructed image from the digital image signals in the wavelength bands using multiple sampling information and outputs the image.

21 Claims, 33 Drawing Sheets

(56) References Cited

OTHER PUBLICATIONS

Y. Oike et al., "A 256×256 CMOS Image Sensor with ΔΣ-Based Single-Shot Compressed Sensing", IEEE International Solid-State Circuits Conference (ISSCC) Dig. of Tech. Papers, pp. 386-387, 2012.

J. Ma, "Improved Iterative Curvelet Thresholding for Compressed Sensing and Measurement", IEEE Transactions on Instrumentation and Measurement, vol. 60, No. 1, pp. 126-136, 2011.

Toshihide Ibaraki et al., "Information Mathematics Course vol. 14 (of 15) Optimization Method" first edition published by Kyoritsu Shuppan Co., Ltd, pp. 159-164, Jul. 20, 1993.

M. V. Afonso et al., "Fast Image Recovery Using Variable Splitting and Constrained Optimization" IEEE Transactions on Image Processing, vol. 19, No. 9, pp. 2345-2356, 2010.

K. Dabov et al., "Image Denoising by Sparse 3-D Transform-Domain Collaborative Filtering", IEEE Trans Image Process., vol. 16, No. 8, pp. 2080-2095, 2007.

D. Takhar et al., "A New Compressive Imaging Camera Architecture using Optical-Domain Compression" Proc. of Computational Imaging IV at SPIE Electronic Imaging, 2006.

\* cited by examiner

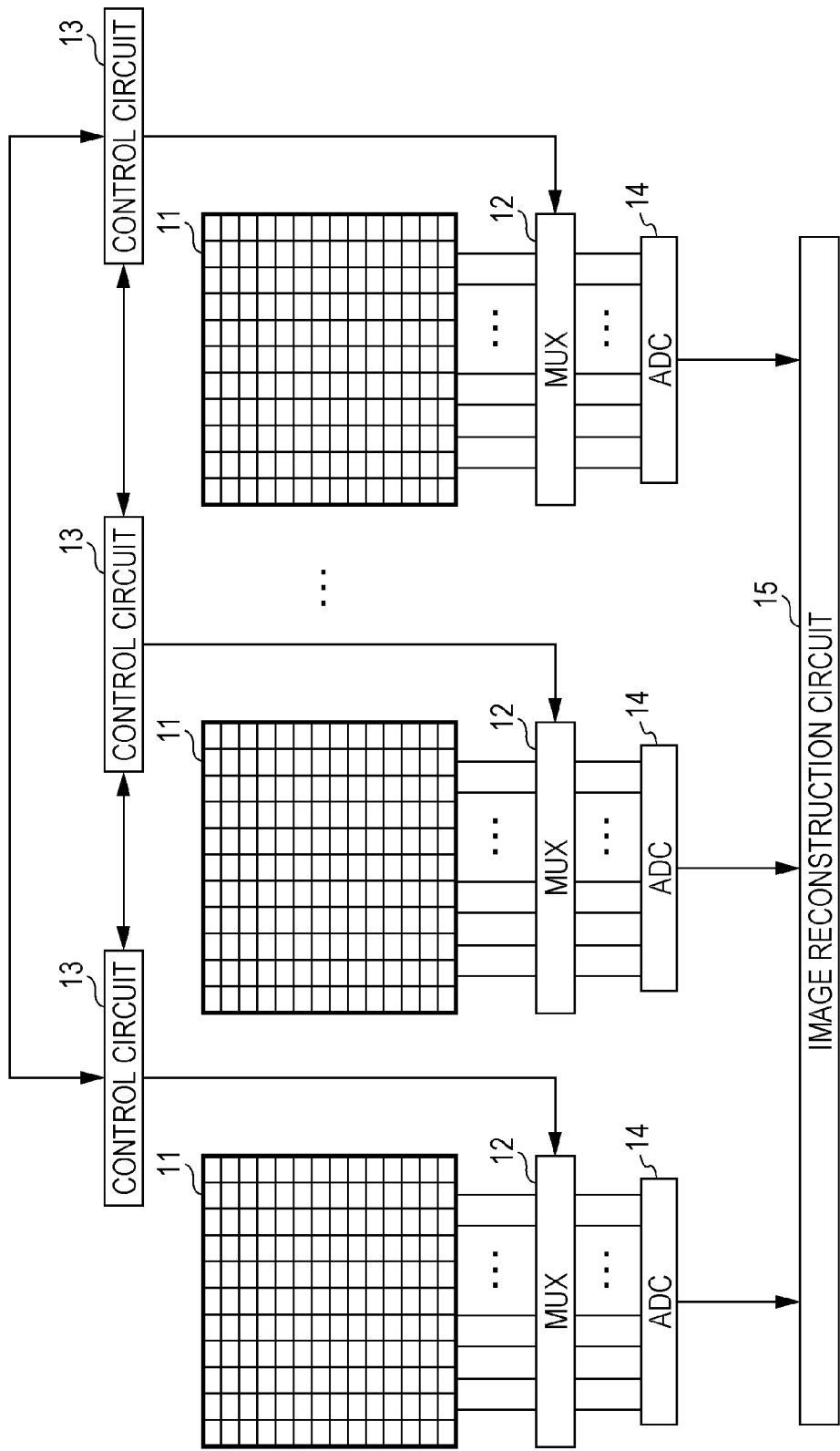

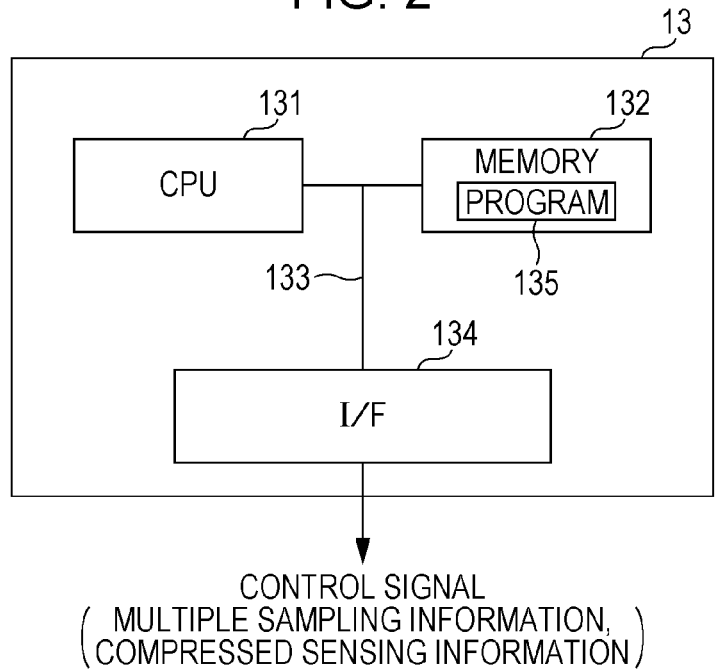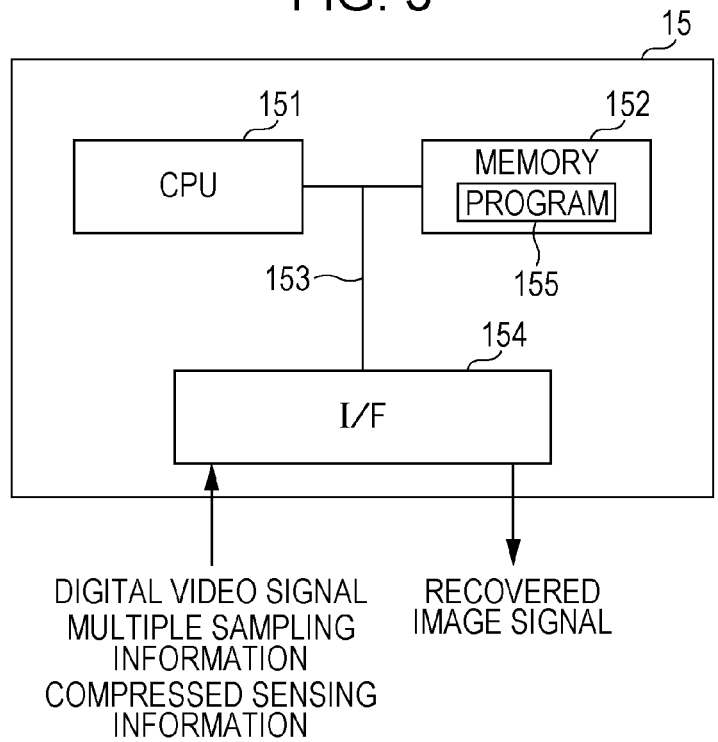

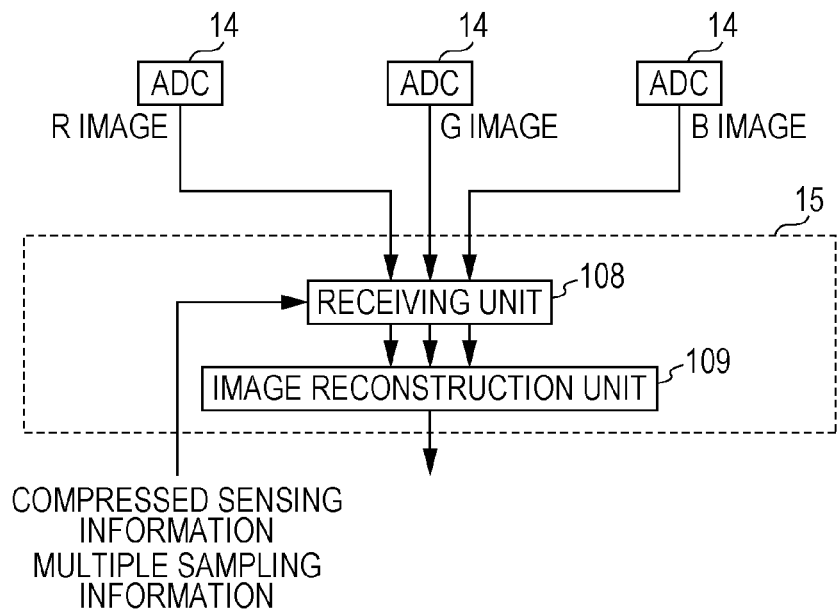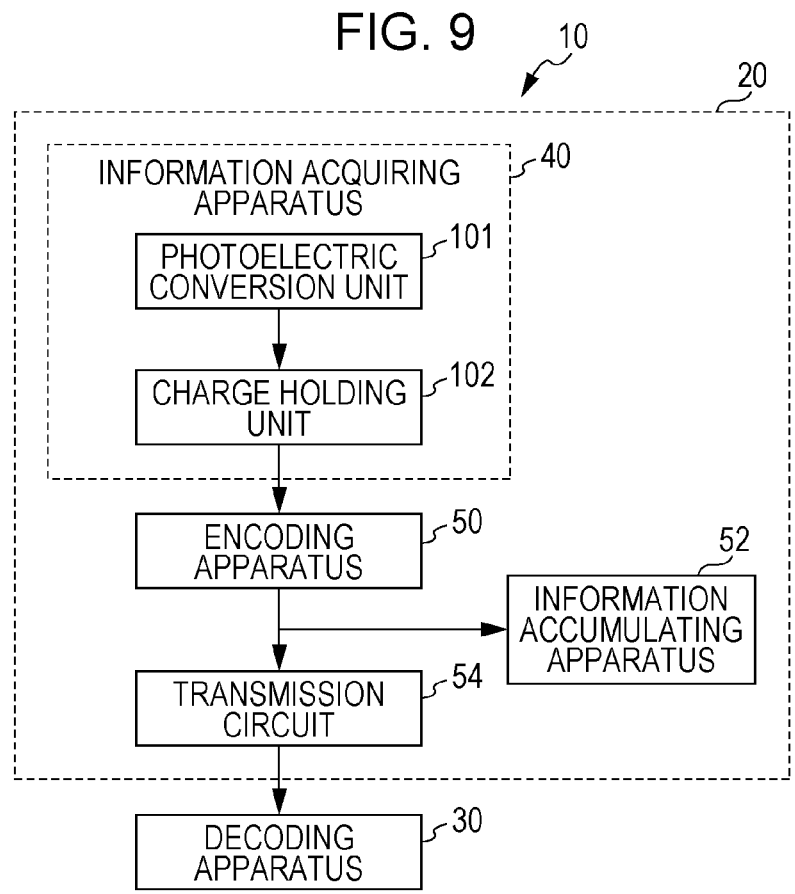

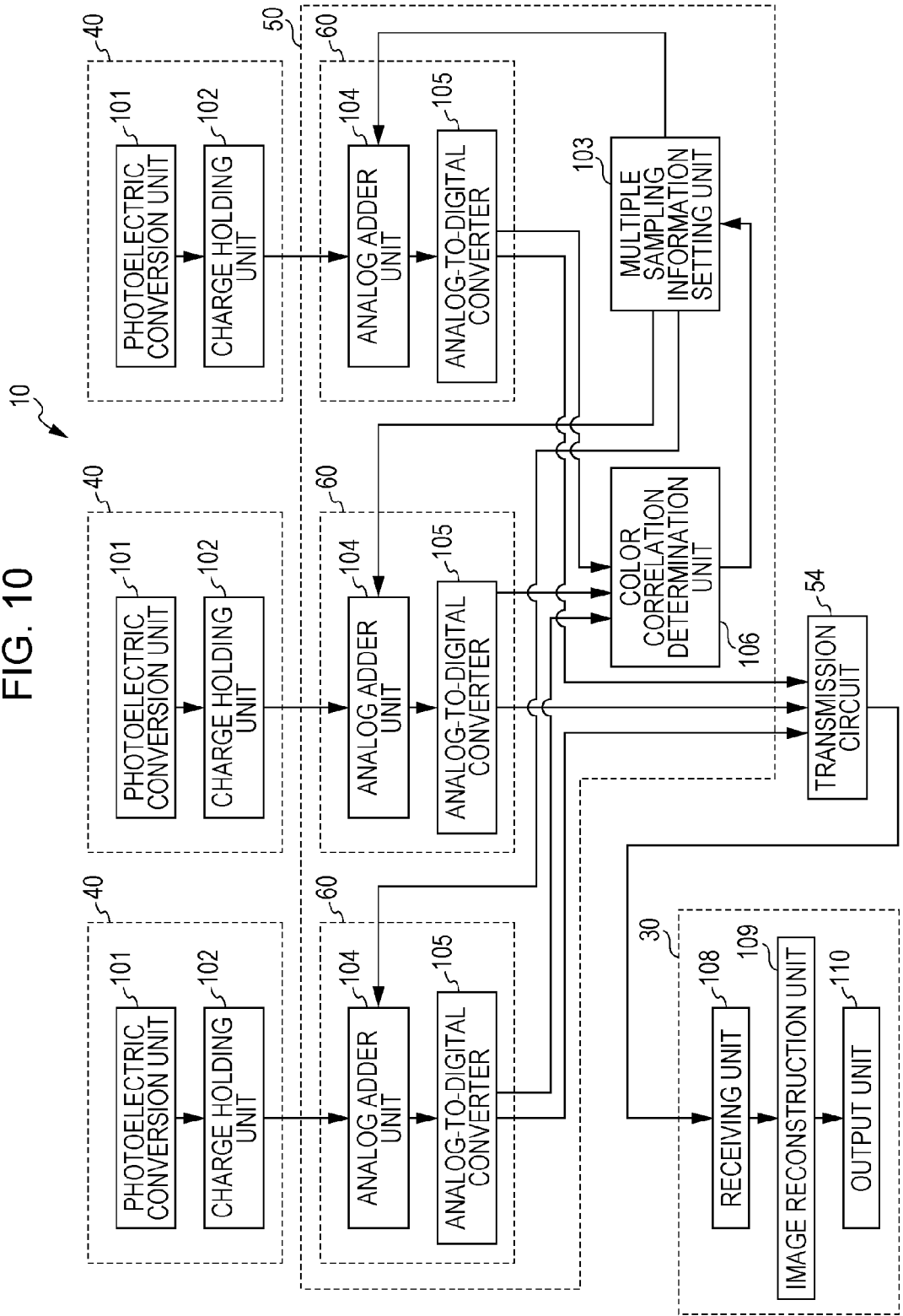

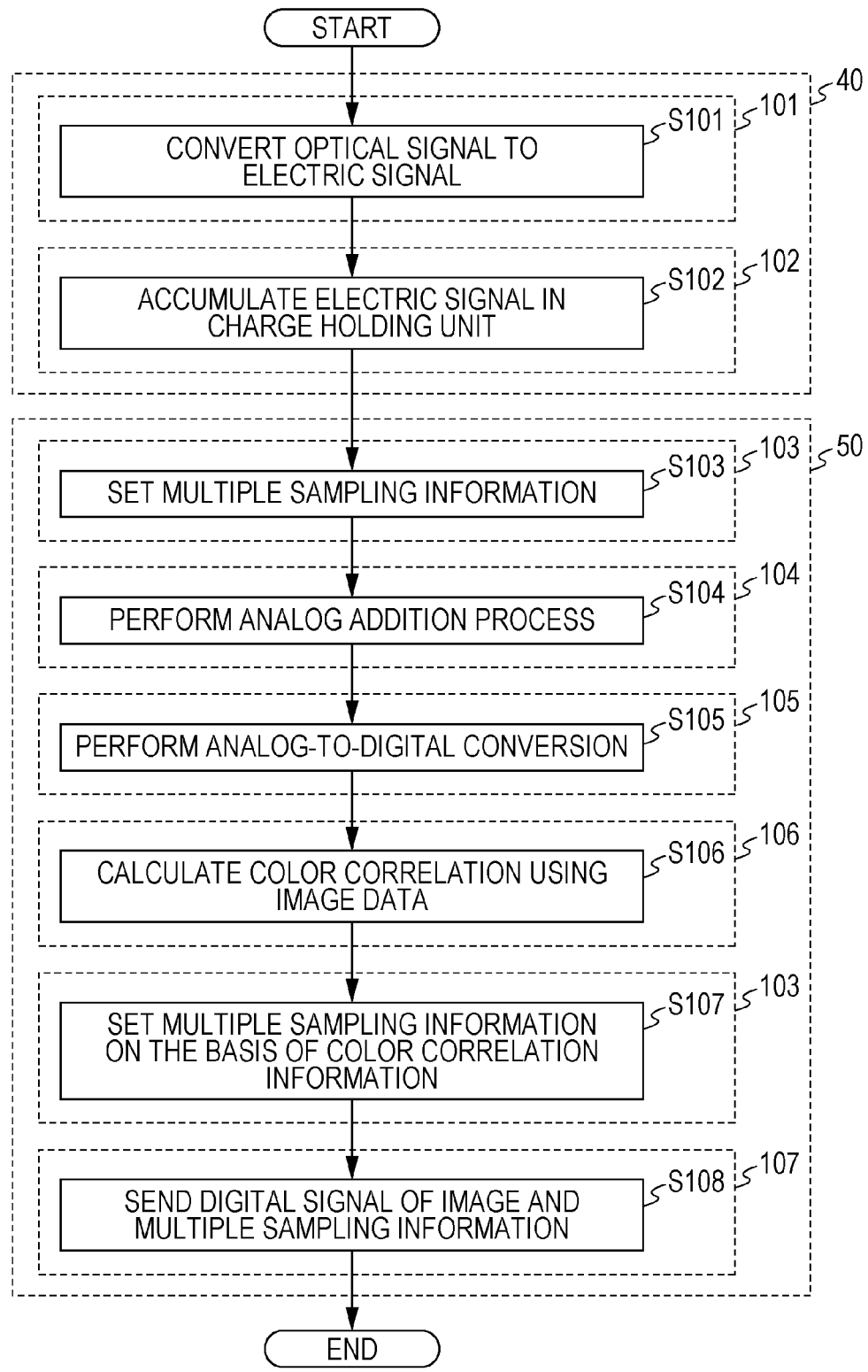

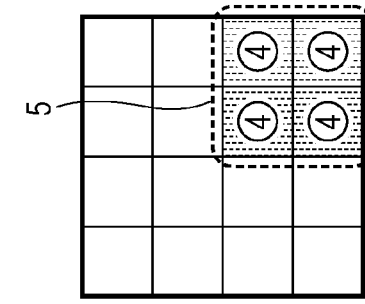
FIG. 14A
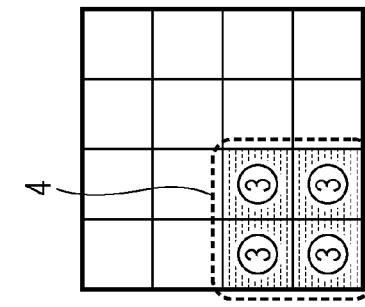
FIG. 14B
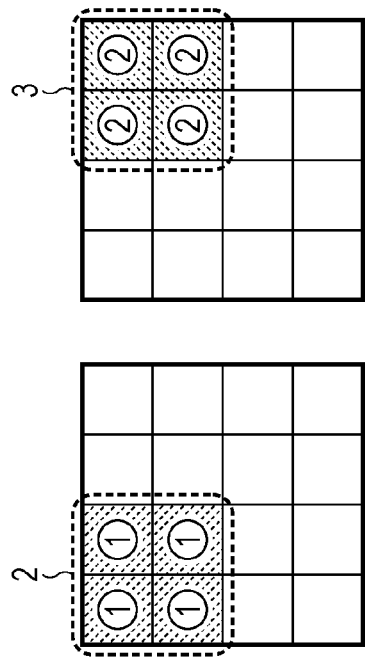
FIG. 14E, FIG. 14F
FIG. 14C
FIG. 14D
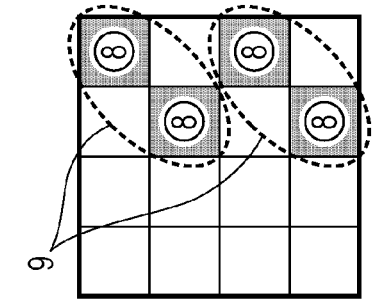
FIG. 14G
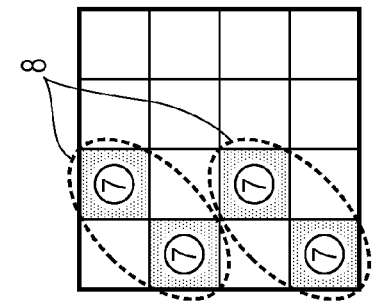
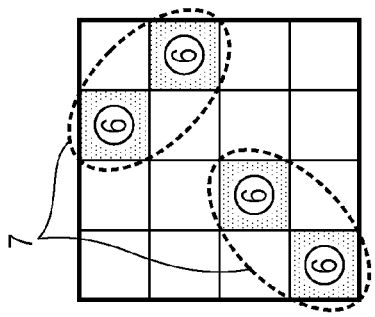
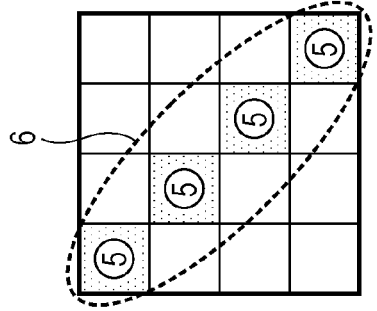
FIG. 14H

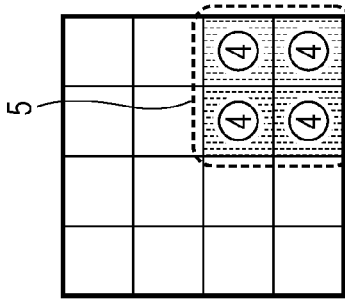
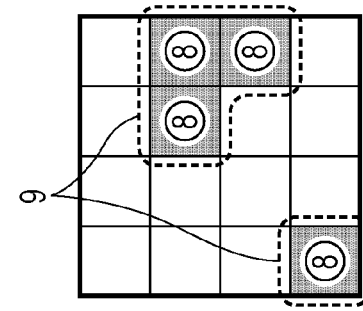
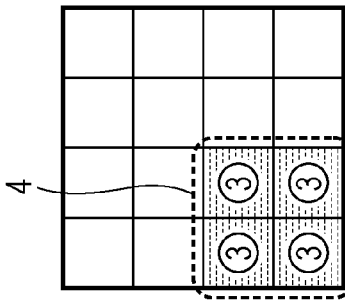
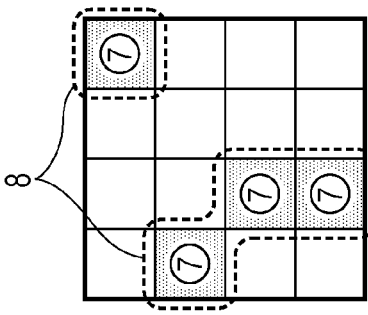
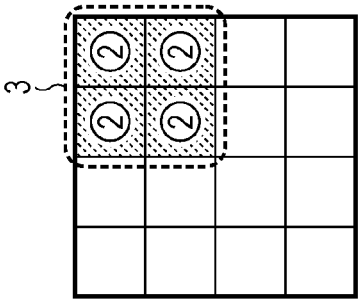
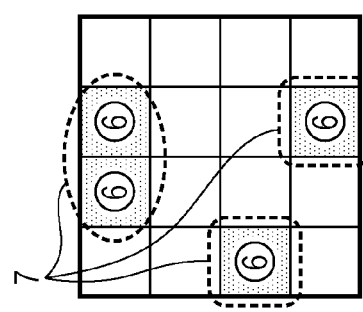
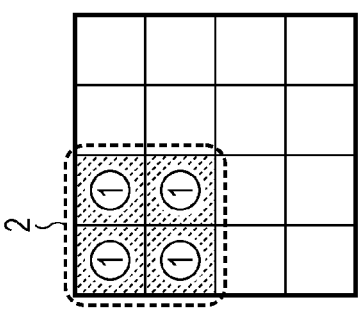
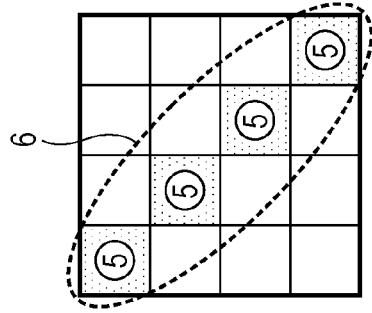

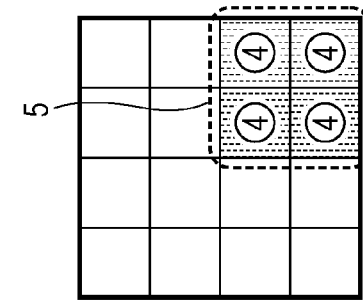
FIG. 16A
FIG. 16B
FIG. 16C
FIG. 16D
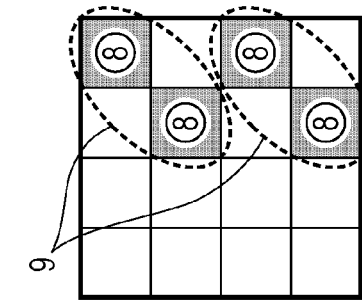
FIG. 16E
FIG. 16F
FIG. 16G
FIG. 16H

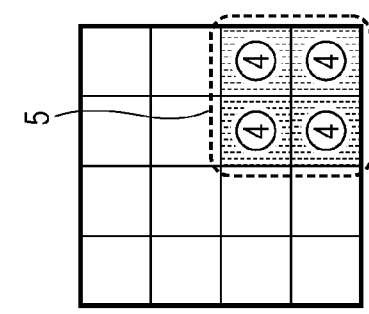
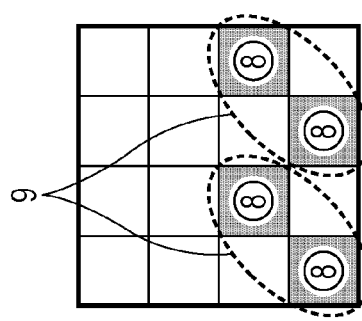
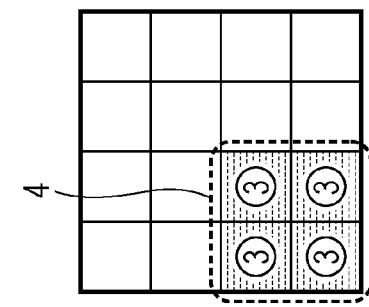
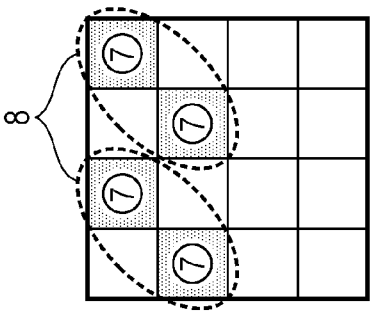
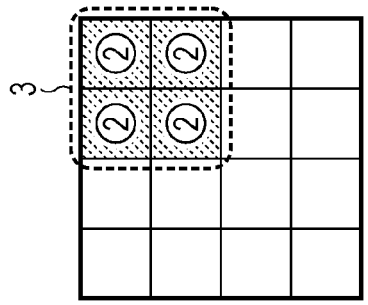
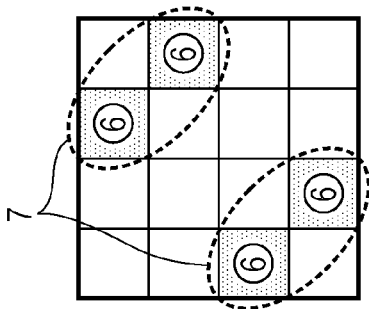
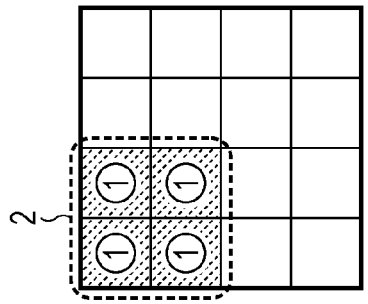
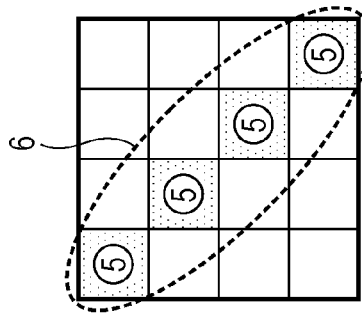

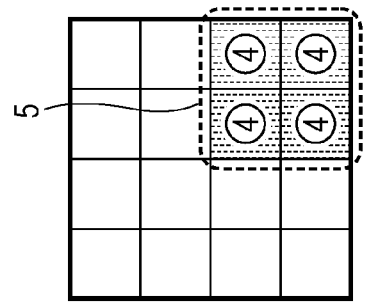
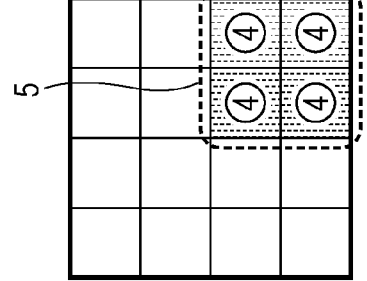
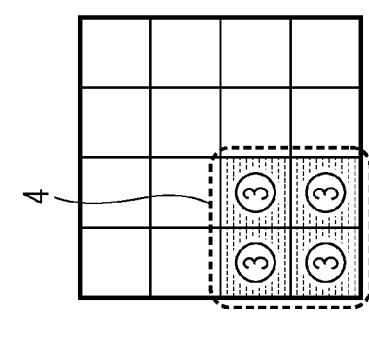
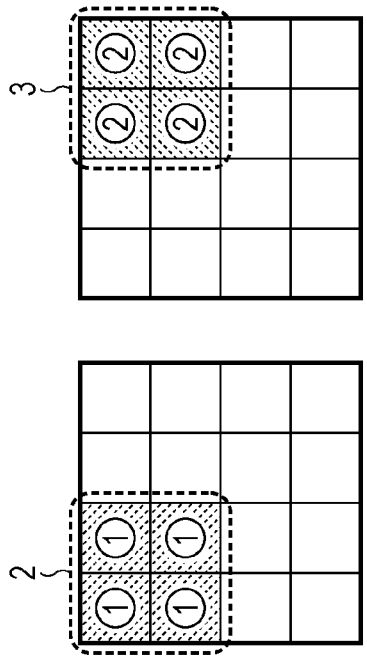
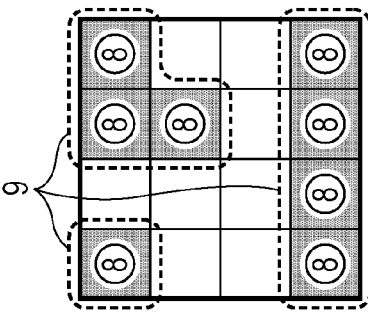
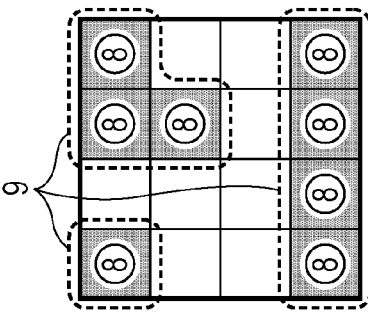
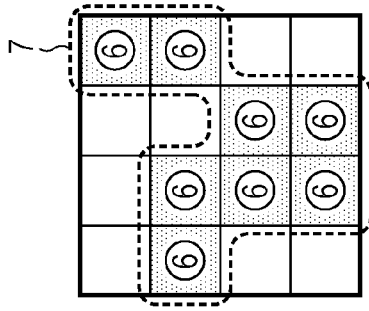
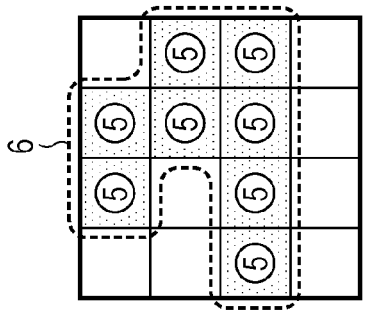

FIG. 23

| TABLE NUMBER | MULTIPLE SAMPLING INFORMATION (CODED DATA) |
|---|---|
| 1 | 1100 1100 0000 0000 0011 0000 0000 0000<br>0000 0000 1100 1100 0000 0011 0011 0011<br>1000 0100 0010 0001 0010 1000 0100 0100<br>0100 1000 0001 0010 0001 0100 1000 1000 |
| 2 | 1100 1100 0000 0000 0011 0011 0000 0000<br>0000 0000 1100 1100 0000 0000 0011 0011<br>0100 0001 0010 1000 1000 0010 0001 0100<br>0001 0100 1000 0010 0010 1000 0100 0001 |
| 3 | 1100 1100 0000 0000 0011 0011 0000 0000<br>0000 0000 1100 1100 0000 0000 0011 0011<br>1000 0001 0100 0010 0010 0100 0001 1000<br>0100 0010 0001 1000 1000 0001 0010 0100 |

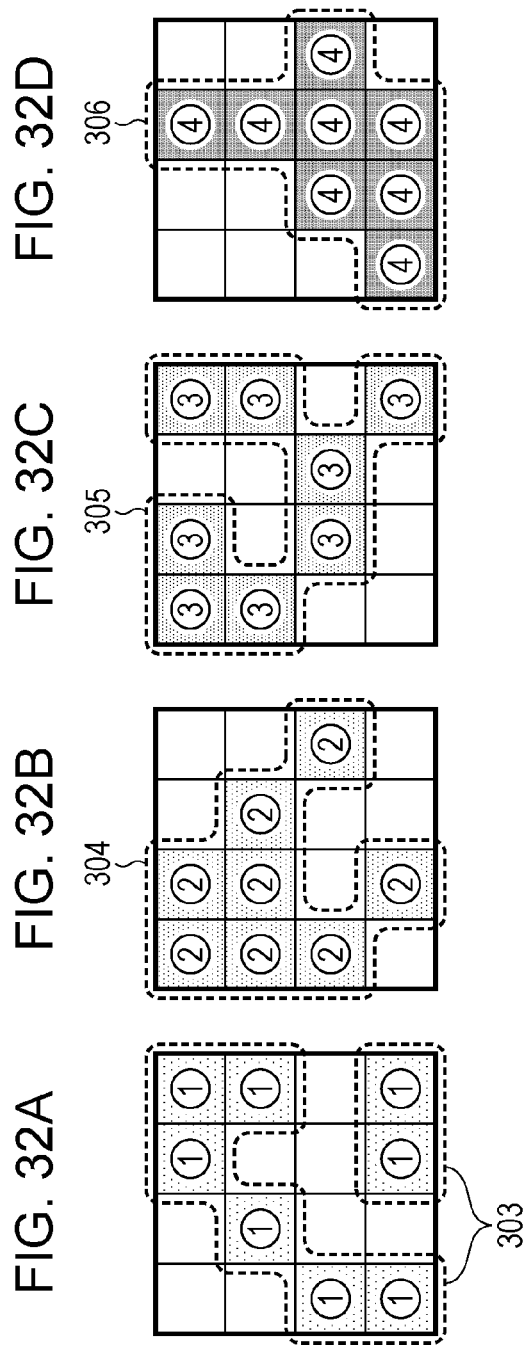

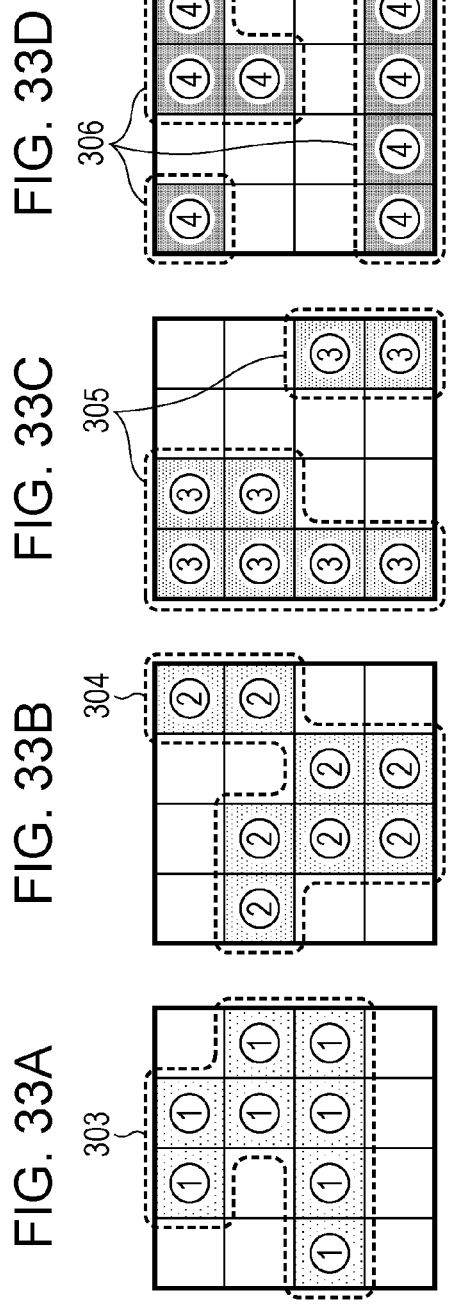

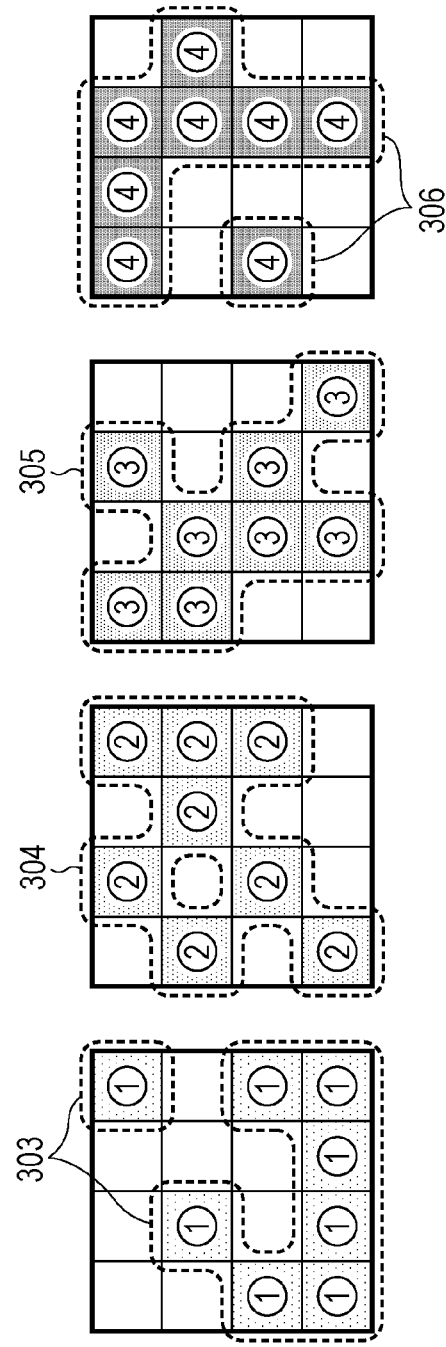

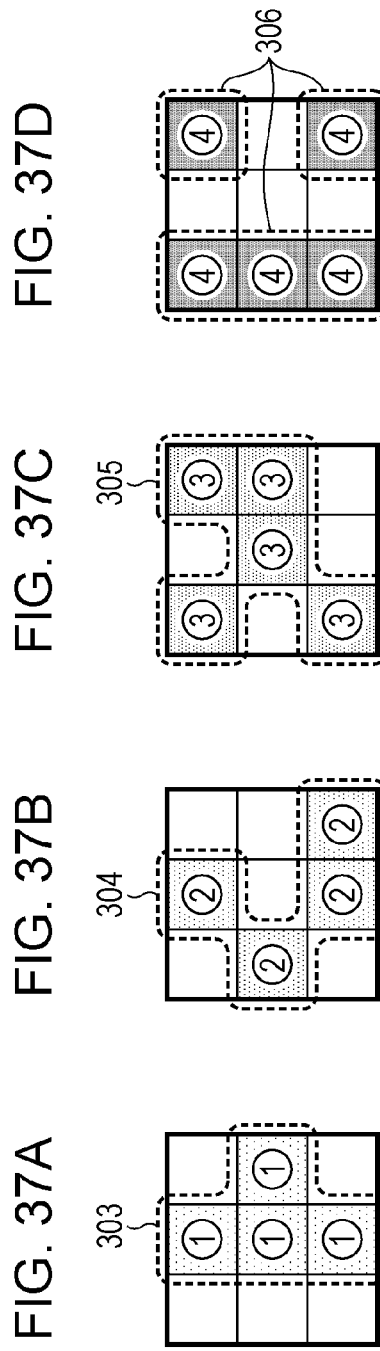

IMAGING SYSTEM, IMAGING APPARATUS, AND IMAGING METHOD

BACKGROUND

1. Technical Field

The present disclosure relates to an imaging system, an imaging apparatus, and an imaging method using a compressed sensing technology.

2. Description of the Related Art

In imaging systems that process video pictures having high resolution and a high frame rate, a large amount of data are read out from an image sensing device and an imaging module and, thus, a large amount of data are transferred from the image sensing device and the imaging module. As a result, the transfer bandwidth needs to be increased. Thus, the transfer frequency needs to be increased, and parallel data transfer needs to be employed. However, such techniques cause a problem for the image sensing devices and the imaging modules that need to be compact. For example, the image quality decreases due to an increase in noise, and the manufacturing cost increases due to an increase in a circuit scale. Accordingly, reduction of the transfer data volume is expected.

To reduce the transfer data volume, a technology known as compressed sensing is effective. The compressed sensing compresses the data volume by performing addition when signals are sensed (during encoding) and decodes the signals by performing a reconstruction process on the compressed data. Such a sensing method is referred to as "addition sampling", and image capturing using an image sensor based on the sampling method is referred to as "multiple sampling image capturing". If multiple sampling image capturing is performed, some amount of image information is lost and, thus, the quality of a reconstructed image significantly deteriorates. To address such an issue, the compressed sensing technology uses the sparsity of an image as previous knowledge. The term "image sparsity" refers to knowledge that when an image is projected into a wavelet space or a discrete cosine (DCT) space, a large number of coefficient values are substantially zero. Compressed sensing uses L0-norm minimization or L1-norm minimization, which is an image reconstruction method using the image sparsity. In this manner, even after the data volume is reduced, a reconstructed image having a quality that is substantially the same as that of an uncompressed image can be obtained.

A method for reconstructing an image generated from data obtained through multiple sampling image capturing by extracting a repetitive structure of an image without using prior learning is described in J. Zhang, D. Zhao, C. Zhao, R. Xiong, S. Ma, and W. Gao, "Compressed Sensing Recovery via Collaborative Sparsity", Proc. of Data Compression Conference, pp. 287-296, 2012 (hereinafter referred to as "Non-Patent Literature 1"). This method is based on prior knowledge called local similarity. The local similarity indicates that in a natural image, a region of interest has a small region similar thereto in the vicinity thereof.

Imaging apparatuses using the compressed sensing technique compress data by using a simple addition process before an analog-to-digital conversion process is performed by an analog-to-digital converter (hereinafter simply referred to as "ADC") in an imaging device. Thus, the drive frequency of ADC can be decreased. In this manner, low power consumption, a high S/N ratio, and reduction of transfer bandwidth can be realized.

For example, a solid-state image sensing device that uses the compressed sensing technique is described in Y. Oike and A. E. Gamal, "A 256×256 CMOS Image Sensor with ΔΣ-Based Single-Shot Compressed Sensing", IEEE International Solid-State Circuits Conference (ISSCC) Dig. of Tech. Papers, pp. 386-387, 2012. The solid-state image sensing device includes a block row selection circuit, a row selection circuit, a column block selection circuit, a multiplexer, a pseudo random pattern generating circuit, and a column parallel ΔΣ-ADC. By using such a configuration, a solid-state image sensing device capable of performing multiple sampling image capturing is achieved.

SUMMARY

In a compressed sensing technique, it is expected to obtain a higher-resolution reconstructed image.

Thus, a non-limiting exemplary embodiment of the present disclosure provides a compressed sensing technique for increasing the image quality of a reconstructed image.

In one general aspect, the techniques disclosed here feature an imaging system including an acquirer that receives light rays in a plurality of wavelength bands and acquires charge signals in each of the wavelength bands, an encoder that performs a multiple sampling process on the charge signals in each of the wavelength bands and encodes image information, and a decoder that decodes the image information encoded by the encoder. In the multiple sampling process, the charge signals of a pixel group having a predetermined arrangement pattern are analog-summed and the sum is converted into a digital signal representing a new signal. The encoder includes a setter that sets up multiple sampling information for identifying at least two pixel groups each to be subjected to the multiple sampling process, the at least two pixel groups include a first pixel group having a first arrangement pattern and a second pixel group having a second arrangement pattern part of which is overlapped with the first arrangement pattern, and combinations of the first arrangement pattern and the second arrangement pattern for all the wavelength bands differ from one another. The encoder further includes a multiple sampler that performs the multiple sampling process on the charge signals in each of the wavelength bands in accordance with the multiple sampling information and outputs digital image signals in the wavelength band. The decoder includes an image reconstructor that generates a reconstructed image from the digital image signals in the wavelength bands using the multiple sampling information and an outputter that outputs the reconstructed image generated by the image reconstructor.

According to the present disclosure, by using a color correlation characteristic having natural images and, thus, performing an multiple sampling processes different for an R image (an image obtained by detecting light in a red wavelength band), a G image (an image obtained by detecting light in a green wavelength band), and a B image (an image obtained by detecting light in a blue wavelength band), a high-resolution image can be reconstructed even in a region in the vicinity of an occlusion boundary. For example, by switching between a multiple sampling process different for the R image, the G image, and the B image and a multiple sampling process the same for the R image, the G image, and the B image in accordance with whether a color correlation exists in the captured image or not when color images are captured using a three imagers system, the above-described process can select multiple sampling optimum for the color information regarding a subject. Thus, the image compression efficiency can be increased, as compared with the case in which all the image signals are acquired at all times.

It should be noted that general or specific embodiments may be implemented as a system, a method, an integrated circuit, a computer program, or a computer-readable recording medium, or any combination of an apparatus, a system, a method, an integrated circuit, a computer program, and a computer-readable recording medium. Examples of the computer-readable recording medium include a nonvolatile recording medium, such as a Compact Disc-Read Only Memory (CD-ROM).

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1 is a schematic illustration of the hardware configuration of an imaging system according to an exemplary embodiment of the present disclosure;

FIG. 2 illustrates an example of the hardware configuration of a control circuit;

FIG. 3 illustrates an example of the hardware configuration of the image reconstruction circuit;

FIG. 8 is a block diagram illustrating the functions of an image reconstruction circuit in detail;

FIG. 9 is a block diagram of the configuration of the imaging system according to an exemplary embodiment;

FIG. 10 is a block diagram of the configuration of the imaging system according to an exemplary embodiment;

FIG. 11 is a flowchart illustrating the procedure for a main process performed by an information acquiring apparatus and an encoding apparatus according to the exemplary embodiment;

FIGS. 14A to 14H illustrate exemplary multiple sampling information set for the G image;

FIGS. 15A to 15H illustrate exemplary multiple sampling information set for the B image;

FIGS. 16A to 16H illustrate exemplary multiple sampling information set for the G image;

FIGS. 17A to 17H illustrate exemplary multiple sampling information set for the B image;

FIGS. 19A to 19H illustrate exemplary multiple sampling information set for the G image;

FIGS. 20A to 20H illustrate exemplary multiple sampling information set for the B image;

FIG. 23 is a schematic illustration of an example of a multiple sampling information table, which is an example of a data expression technique of coded data;

FIGS. 32A to 32D are schematic illustrations of the multiple sampling process performed for the R image when four digital signals are output from 4-by-4 (16) pixels;

FIGS. 33A to 33D are schematic illustrations of the multiple sampling process performed for the G image when four digital signals are output from 4-by-4 (16) pixels;

FIGS. 34A to 34D are schematic illustrations of the multiple sampling process performed for the B image when four digital signals are output from 4-by-4 (16) pixels;

FIGS. 37A to 37D are schematic illustrations of the multiple sampling process performed for the B image when four digital signals are output from 3-by-3 (9) pixels.

DETAILED DESCRIPTION

Figure 4:
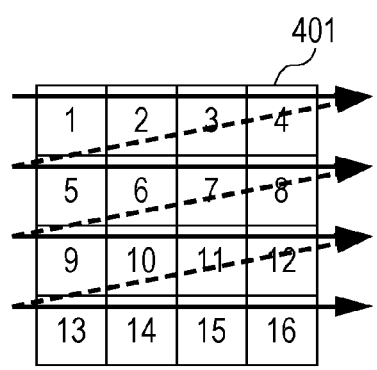
FIG. 4 illustrates the arrangement of 4-by-4 (16) pixels used as an example.

In existing compressed sensing techniques, the sparsity of an image is used.

However, in general images, the sparsity of an image is not always obtained. For example, in moving image scenes captured by a camera that is moving and a region of an image in the vicinity of an occlusion boundary captured by a light field camera, such as a multi-viewpoint image captured by the camera located at different positions, the appearance of a subject significantly differs from image to image. Accordingly, the local similarity is negligibly applied. For such images, a high-resolution reconstruction image cannot be obtained even when the technique described in Non-Patent Literature 1 is employed.

The outline of an aspect of the present disclosure is described below.

According to an aspect of the present disclosure, an imaging system including an acquirer that receives light rays in a plurality of wavelength bands and acquires charge signals in each of the wavelength bands, an encoder that performs a multiple sampling process on the charge signals in each of the wavelength bands and encodes image information, and a decoder that decodes the image information encoded by the encoder. In the multiple sampling process, the charge signals of a pixel group having a predetermined arrangement pattern are analog-summed and the sum is converted into a digital signal representing a new signal. The encoder includes a setter that sets up multiple sampling information for identifying at least two pixel groups each to be subjected to the multiple sampling process, the at least two pixel groups include a first pixel group having a first arrangement pattern and a second pixel group having a second arrangement pattern part of which is overlapped with the first arrangement pattern, and combinations of the first arrangement pattern and the second arrangement pattern for all the wavelength bands differ from one another. The encoder further includes a multiple sampler that performs the multiple sampling process on the charge signals in each of the wavelength bands in accordance with the multiple sampling information and outputs digital image signals in the wavelength band. The decoder includes an image reconstructor that generates a reconstructed image from the digital image signals in the wavelength bands using the multiple sampling information and an outputter that outputs the reconstructed image generated by the image reconstructor.

The imaging system further includes a color correlation determiner that receives the digital image signals in each of the wavelength bands, calculates a color correlation among the signals in the wavelength bands, and determines the existence of the color correlation among the digital image signals. The setter sets the multiple sampling information using a result of the determination regarding color correlation made by the color correlation determiner.

The image reconstructor reconstructs an image so that local similarity of the image indicated by the digital image signals in each of the wavelength bands becomes high.

According to another aspect of the present disclosure, an imaging apparatus includes an acquirer that receives light rays in a plurality of wavelength bands and acquires charge signals in each of the wavelength bands and an encoder that performs a multiple sampling process on the charge signals in the wavelength bands and encodes image information. In the multiple sampling process, the charge signals of a pixel group having a predetermined arrangement pattern are analog-summed and the sum is converted into a digital signal representing a new signal. The encoder includes a setter that sets up multiple sampling information for identifying at least two pixel groups to be subjected to the multiple sampling process, the at least two pixel groups include a first pixel group having a first arrangement pattern and a second pixel group having a second arrangement pattern part of which is overlapped with the first arrangement pattern under a predetermined condition, and combinations of the first arrangement pattern and the second arrangement pattern for all the wavelength bands differ from one another. The encoder further includes a multiple sampler that performs the multiple sampling process on the charge signals in each of the wavelength bands in accordance with the multiple sampling information and outputs image signals in each of the wavelength bands.

The acquirer receives light rays in first, second, and third wavelength bands representing the plurality of wavelength bands and acquires analog charge signals in each of the first, second, and third wavelengths. The multiple sampler of the encoder includes an adder that performs an analog multiple process on the analog charge signals in each of the wavelength bands in accordance with the multiple sampling information and generates an analog multiple signal in each of the wavelength bands. The multiple sampler further includes a converter that converts the analog multiple signal in each of the wavelength bands into a digital image signal in the wavelength band.

The imaging apparatus further includes a color correlation determiner that receives an image signal in each of the wavelength bands output from the multiple sampler and determines the existence of color correlation among the image signals. The setter sets, as the predetermined condition, the multiple sampling information using a result of the determination regarding a color correlation made by the color correlation determiner.

The multiple sampling process performed on the charge signals in each of the wavelength bands on the basis of the multiple sampling information includes a first multiple sampling process using the charge signals at pixel positions that are common to the charge signals in all the wavelength bands and a second multiple sampling process using the charge signals at pixel positions that are not common to the charge signals in all the wavelength bands. The color correlation determiner determines the existence of a color correlation among the image signals using image signals in the wavelength bands output from the first multiple sampling process performed on charge signals in the wavelength bands.

The setter sets the multiple sampling information so that a difference ratio of the multiple sampling process is relatively high among the image signals in the wavelength bands if the result of determination regarding a color correlation made by the color correlation determiner meets a predetermined standard, and the setter sets the multiple sampling information so that a difference ratio of the multiple sampling process is relatively low among the image signals in the wavelength bands if the result of determination regarding color correlation made by the color correlation determiner does not meet the predetermined standard.

The acquirer acquires first, second, and third image signals representing image signals in the first, second, and third wavelength bands, respectively. The color correlation determiner calculates a color correlation value among the first, second, and third image signals, and the setter sets the multiple sampling information regarding the first image signal and the multiple sampling information regarding the second image signal so that the multiple sampling process performed on the first image signal differs from the multiple sampling process performed on the second image signal if the color correlation value meets a predetermined standard.

A plurality of pieces of the multiple sampling information are provided in advance. The setter selects, from among the pieces of the multiple sampling information, a piece of the multiple sampling information corresponding to the multiple sampling process to be performed on the first image signal and a piece of the multiple sampling information corresponding to the multiple sampling process to be performed on the second image signal in accordance with a magnitude of the color correlation value.

The setter sets the multiple sampling information so that a level of difference between the multiple sampling process performed on the first image signal and the multiple sampling process performed on the second signal is relatively high.

The acquirer acquires first, second, and third image signals representing image signals in the first, second, and third wavelength bands, respectively. The color correlation determiner calculates the color correlation value among the first, second, and third image signals. If the color correlation value does not meet a predetermined standard, the setter sets the multiple sampling information regarding each of the first, second, and third image signals so that the multiple sampling processes performed on the first, second, and third image signals are the same.

The acquirer receives light rays in blue, green, and red wavelength bands serving as light rays in first, second, and third wavelength bands and acquires analog charge signals in each of the red, green, and blue wavelength bands.

The acquirer includes three image sensing devices that generate the charge signals in the red, green, and blue wavelength bands.

The acquirer receives light rays in cyan, magenta, and yellow wavelength bands serving as light rays in first, second, and third wavelength bands, respectively, and acquires analog charge signals in each of the cyan, magenta, and yellow wavelength bands.

The acquirer receives light rays in a plurality of wavelength bands whose exposure times differ from one another and acquires analog charge signals in each of the wavelength bands.

The acquirer receives light rays in four or more wavelength bands and acquires analog charge signals in each of the wavelength bands.

The setter sets the multiple sampling information for identifying each of the at least two pixel groups from among P×Q pixels, where each of P and Q is an integer greater than or equal to 2. The multiple sampler performs the multiple sampling process on the charge signals in the at least two pixel groups identified by the multiple sampling information for each of the wavelength bands and outputs less than P×Q image signals in the wavelength band.

The setter sets the multiple sampling information for identifying each of the at least two pixel groups from among N×N pixels, where N=P=Q.

The setter sets the multiple sampling information for identifying each of the at least two pixel groups from among L×1 pixels or 1×L pixels, where L is an integer greater than or equal to 4. The multiple sampler performs the multiple sampling process on the charge signals in each of the at least two the pixel groups identified by the multiple sampling information for each of the wavelength bands and outputs less than L image signals in the wavelength bands.

The imaging apparatus further includes an image accumulater that accumulates, in a recording medium, the multiple sampling information set by the setter and the image signal in each of the wavelength bands output from the multiple sampler.

The recording medium is removable from the image accumulater.

According to still another aspect of the present disclosure, an imaging method includes receiving light rays in a plurality of wavelength bands and acquiring charge signals in each of the wavelength bands and performing a multiple sampling process on the charge signals in the wavelength bands and encoding image information. In the multiple sampling process, the charge signals of a pixel group having a predetermined arrangement pattern are analog-summed and the sum is converted into a digital signal representing a new signal. The encoding image information includes setting up multiple sampling information for identifying at least two pixel groups subjected to the multiple sampling process, the at least two pixel groups includes a first pixel group having a first arrangement pattern and a second pixel group having a second arrangement pattern part of which is overlapped with the first arrangement pattern under a predetermined condition, and combinations of the first arrangement pattern and the second arrangement pattern for all the wavelength bands differ from one another. The encoding image information further includes performing the multiple sampling process on the charge signals in each of the wavelength bands in accordance with the multiple sampling information and outputting image signals in each of the wavelength bands.

According to yet still another aspect of the present disclosure, a decoding method includes acquiring image signals in each of the wavelength bands and multiple sampling information, generating a reconstructed image from the image signals in the wavelength bands using the multiple sampling information, and outputting the reconstructed image. The image signals in each of the wavelength bands are image signals obtained by performing a multiple sampling process on charge signals in the wavelength band under the control in accordance with the multiple sampling information. The multiple sampling information indicates that the multiple sampling processes performed on at least two of the charge signal in the wavelength bands differ from one another.

The generating the reconstructed image uses the local similarity of each of the images in terms of digital image signals in each of the wavelength bands.

The generating the reconstructed image uses a normalized cross-correlation to calculate the local similarity of the image.

According to still another aspect of the present disclosure, an imaging apparatus includes a first acquirer having a first plurality of pixels including a first pixel, the first plurality of pixels receiving a first wavelength band light ray of a light ray including the first wavelength band light ray and a second wavelength band light ray and outputting a first plurality of pixel values including a first pixel value of the first pixel, a second acquirer having a second plurality of pixels including a second pixel, the second plurality of pixels receiving the second wavelength band light ray and outputting a second plurality of pixel values including a second pixel value of the second pixel, a first adder that outputs a first multiple signal obtained by summing the first pixel value and a third plurality of pixel values provided by a third plurality of pixels and outputs a second multiple signal obtained by summing the first pixel value and a fourth plurality of pixel values provided by a fourth plurality of pixels, a first converter that converts the first multiple signal into a first digital signal and converts the second multiple signal into a second digital signal, a second adder that outputs a third multiple signal obtained by summing the second pixel value and a fifth plurality of pixel values provided by a fifth plurality of pixels and outputs a fourth multiple signal obtained by summing the second pixel value and a sixth plurality of pixel values provided by a sixth plurality of pixels, and a second converter that converts the third multiple signal into a third digital signal and converts the fourth multiple signal into a fourth digital signal. The first plurality of pixels includes the third plurality of pixels and the fourth plurality of pixels. The first plurality of pixel values includes the third plurality of pixel values and the fourth plurality of pixel values. In the first acquirer, at least one pixel included in the third plurality of pixels differs from at least one pixel included in the fourth plurality of pixels. The second plurality of pixels includes the fifth plurality of pixels and the sixth plurality of pixels. The second plurality of pixel values includes the fifth plurality of pixel values and the sixth plurality of pixel values. In the second acquirer, at least one pixel included in the fifth plurality of pixels differs from at least one pixel included in the sixth plurality of pixels. Physical locations of the first pixel and the third plurality of pixels in the first acquirer and physical locations of the second pixel and the fifth plurality of pixels in the second acquirer have a first one-to-one relationship. Physical locations of the first pixel and the fourth plurality of pixels in the first acquirer and physical locations of the second pixel and the sixth plurality of pixels in the second acquirer have a second one-to-one relationship. The first one-to-one relationship differs from the second one-to-one relationship.

Exemplary embodiments of the present disclosure are described below with reference to the accompanying drawings.

FIG. 1 is a schematic illustration of the hardware configuration of an imaging system 10 according to an exemplary embodiment of the present disclosure. In the following description, for simplicity, a three imagers system including three image sensing devices is described. The three image sensing devices sense a red image obtained by sensing light in a red wavelength band (a first wavelength band) (hereinafter, the image is referred to as an "R image"), a green image obtained by sensing light in a green wavelength band (a second wavelength band distinct from the first wavelength band) (hereinafter, the image is referred to as a "G image"), and a blue image obtained by sensing light in a blue wavelength band (a third wavelength band distinct from the first and second wavelength bands) (hereinafter, the image is referred to as a "B image").

However, the imaging system according to the present exemplary embodiment is not limited to three imagers system. For example, according to the present disclosure, the imaging system captures a long-time exposure image and a short-time exposure image and combines the two images using a widely known technique (e.g., a technique described in international publication International Publication No. WO 2009/019823). Thus, the imaging system functions as a wide dynamic range imaging system that increases the dynamic range of the image can be provided. Alternatively, according to the present disclosure, the imaging system may be a multi-band imaging system that captures images in a plurality of wavelength bands or a single panel imaging system that captures a color image by changing a color filter, such as a Bayer pattern, for each of pixels. Still alternatively, even in a three imagers system, the wavelength bands used need not be limited to R (red)/G (green)/B (blue) wavelength bands. For example, three wavelength bands, that is, cyan/magenta/yellow wavelength bands, which are known as the complementary colors, may be used.

The imaging system 10 includes three image sensing devices 11 that captures an R image, a G image, and a B image. The imaging system 10 further includes a multiplexer (MUX) 12, a control circuit 13, and an ADC 14 for each of the image sensing devices 11. The imaging system 10 still further includes an image reconstruction circuit 15.

Each of the image sensing devices 11 is formed as a pixel array including a plurality of pixels. The image sensing device 11 converts a received optical signal into an electrical signal. More specifically, each pixel of the image sensing device 11 receives light, accumulates electrical charge in accordance with the intensity of the incident light, and outputs the electrical charge. The image sensing device 11 that captures an R image includes a first filter (not illustrated) having a high sensitivity to red light. The image sensing device 11 that captures a G image includes a second filter (not illustrated) having a high sensitivity to green light. The image sensing device 11 that captures a B image includes a third filter (not illustrated) having a high sensitivity to blue light. In this manner, each of the image sensing devices 11 obtains an image by detecting light in the corresponding wavelength band. Note that the image sensing device 11 that captures an R image is referred to as an "R image sensing device", the image sensing device 11 that captures a G image is referred to as a "G image sensing device", and the image sensing device 11 that captures a B image is referred to as a "B image sensing device".

The multiplexer 12 sums the pixel values (the charge signals) of a plurality of pixels. The process is referred to as an "analog multiple process". More specifically, the term "analog multiple process" refers to a process to sum the charge signal of a pixel located at a given position and the charge signal of a pixel located at a position having a predetermined relationship with the given position and generate a new signal. The analog multiple process is performed on analog charge signals. Thus, the obtained signal is also an analog charge signal.

The control circuit 13 generates a control signal used to control the analog multiple process performed by the multiplexer 12 and outputs the generated signal to the multiplexer 12. The control signal serves as multiple sampling information described below.

The ADC 14 converts the analog charge signal obtained through the analog multiple process into a digital signal. The analog multiple process using the multiplexer 12 itself or the analog multiple process and the conversion process for concerting the analog charge signal into a digital signal performed by the ADC 14 are also referred to as an "multiple sampling process". That is, the term "analog sampling process" refers to a process to analog-sum the charge signal of a pixel located at a given position and the charge signal of a pixel located at a position having a predetermined relationship with the given position and converts the summed analog signal into a digital signal. Note that at that time, a charge signal at least one position is read out a plurality of times and is added to a plurality of digital signals. The multiple sampling process is performed on analog charge signals, and a digital signal is obtained. The multiple sampling process according to the present exemplary embodiment is described in more detail below.

The ADC 14 is formed as, for example, a $\Delta\Sigma$-ADC having a $\Delta\Sigma$-modulator and a digital filter (neither is illustrated) connected in series. The $\Delta\Sigma$-modulator receives an analog signal and converts the analog signal into a 1-bit pulse waveform (a digital waveform) sampled at a rate higher than a supposed sampling rate. The digital filter limits the band of the pulse wave and decimates the pulse wave. Thereafter, the digital filter outputs a multi-bit digital signal at the supposed sampling rate.

The image reconstruction circuit 15 generates, from the digital signal converted by the ADC 14, an image that is supposed to be originally formed by the image sensing device 11 (i.e., the image before the analog addition process is performed). Such a process is referred to as "image reconstruction". Note that the image reconstruction circuit 15 does not know what is an image originally generated by the image sensing device 11. The term "reconstructed image" is referred to as an image generated through the process performed by the image reconstruction circuit 15 described below.

An example of the hardware configurations of the control circuit 13 and the image reconstruction circuit 15 are described below with reference to FIGS. 2 and 3.

The following description is made with reference to the image reconstruction circuit 15 that is not a single circuit but a circuit having a CPU and a memory mounted therein. However, by integrating such circuit into one chip, the image reconstruction circuit 15 can be formed as a single circuit. The image reconstruction circuit 15 can be a single circuit or multiple circuits if the circuit realizes the functions described herein.

FIG. 2 illustrates an example of the hardware configuration of the control circuit 13.

The control circuit 13 includes a CPU 131, a memory 132, a bus 133, and an interface (I/F) 134.

The CPU 131 executes a computer program 135 stored in the memory 132 and determines whether the compressed sensing is performed or not. Thereafter, the CPU 131 generates compressed sensing information indicating the result of the determination. That is, the compressed sensing information indicates whether compressed sampling has been performed or not. If it is determined that the compressed sensing is performed, the CPU 131 additionally generates multiple sampling information. The multiple sampling information is used to identify a sampling method for use in a multiple sampling process performed using pixel signals obtained from a plurality of pixels. That is, the multiple sampling information is set to control a multiple sampling process. Note that if the compressed sensing is not performed, it is not necessary to send multiple sampling information.

A general description of the multiple sampling process and a description of the image reconstruction process are described below.

The CPU 131 outputs the generated compressed sensing information and multiple sampling information to the multiplexer 12 via the bus 133 and the I/F 134 as a control signal. In this manner, the control circuit 13 can cause the multiplexer 12 to change the sampling method for use in the multiple sampling process. This process is described in more detail below.

FIG. 3 illustrates an example of the hardware configuration of the image reconstruction circuit 15.

The image reconstruction circuit 15 includes a CPU 151, a memory 152, a bus 153, and an interface (I/F) 154. The I/F 154 receives a digital video signal and the compressed sensing information. The I/F 154 further receives the multiple sampling information as needed. The digital video signal is a digital signal of an image subjected or not subjected to the compressed sampling. As described above, the compressed sensing information indicates whether the compressed sampling has been performed. When the compressed sampling is performed, the multiple sampling information indicates the sampling method employed. Alternatively, it may be determined whether compressed sampling has been performed by the presence/absence of the multiple sampling information.

The I/F 154 sends the received digital video signals to the memory 152 via the bus 153. The memory 152 stores digital data corresponding to the digital signals. The CPU 151 executes a computer program 155 loaded into the memory 152 and performs a predetermined process. For example, the CPU 151 determines whether the compressed sensing information indicates that the compressed sensing has been performed. If the compressed sensing information indicates that the compressed sensing has been performed, the CPU 151 further refers to the multiple sampling information and identifies the sampling method. Thereafter, the CPU 151 reconstructs an image supposed to be originally formed by the image sensing device 11 from the digital data stored in the memory 152 using the identified sampling method.

The above-mentioned multiple sampling process and image reconstruction process are described below. For simplicity, in the following description, eight signals are sampled for 4-by-4 (16) pixels.

FIG. 4 illustrates the arrangement of 4-by-4 (16) pixels used as an example described herein. In FIG. 4, each of the 4-by-4 pixels is identified by a pixel number. That is, the 4-by-4 pixels are identified by the pixel numbers "1", "2", "3", and "4" from the pixel located at the upper left corner to the right. Similarly, the pixels in the next row are identified by the pixel numbers "5", "6", . . . from the pixel located at the leftmost position to the right, and the pixel located at the lower right corner is identified by the pixel number "16". For example, a pixel 401 has a pixel number of "4".

FIGS. 5A to 5H, FIGS. 6A to 6H, and FIGS. 7A to 7H are schematic illustrations illustrating the multiple sampling process for an R image, a G image, and a B image, respectively. The multiple sampling process is performed by the multiplexer 12 on the basis of the multiple sampling information.

FIGS. 5A to 5H illustrate which pixels provide charge signals to generate each of the eight digital signals for the R image at a time t=1. That is, in each of FIGS. 5A to 5H, the pixels having numbers are used in the multiple sampling process. By summing the charge signals output from the pixels, a digital signal is generated. As illustrated in FIGS. 5A to 5H, in the multiple sampling process, the charge signal of a pixel located at least one position is read out a plurality of times and are added to a plurality of digital signals.

As used herein, a group of pixels adjacent to each other illustrated in each of FIGS. 5A to 5H and used in the multiple sampling process is referred to as a "readout pixel group". In FIGS. 5A to 5H, readout pixel groups 2 to 9 each surrounded by a dotted line and including pixels each having a circled number (one of 1 to 8) are illustrated. The readout pixel groups 2 to 9 have pixel arrangement patterns that differ from one another.

In addition, FIGS. 6A to 6H illustrate which pixels provide charge signals to generate each of the eight digital signals for the G image at the time t=1. FIGS. 7A to 7H illustrate which pixels provide charge signals to generate each of the eight digital signals for the B image at the time t=1. As can be seen from FIGS. 5A to 5D, FIGS. 6A to 6D, and FIGS. 7A to 7D, the positions of pixels in each of the readout pixel groups 2 to 5 in the image sensing device are the same for the R image, the G image, and the B image. In contrast, as can be seen from FIGS. 5E to 5H, FIGS. 6E to 6H, and FIGS. 7E to 7H, the positions of pixels in the readout pixel groups 6 to 9 for the R image, the G image, and the B image in the image sensing device differ from one another. In this manner, sampling is performed so that the whole multiple sampling patterns are not the same for the R image, the G image, and the B image. As described below, by performing such multiple sampling, the quality of a reconstructed image can be increased.

Figure 5D:
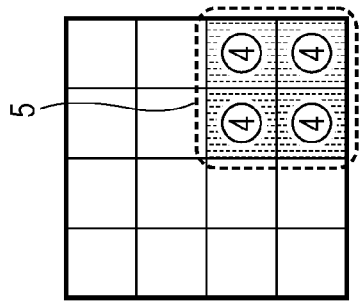
FIGS. 5A to 5H illustrate which pixels provide charge signals to be summed in order to obtain each of eight digital signals for an R image at t=1.
Figure 5C:
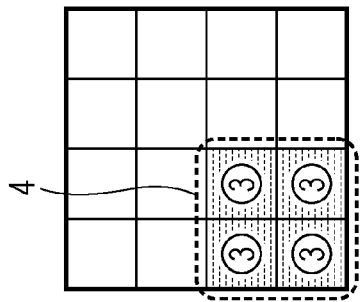
Figure 5B:
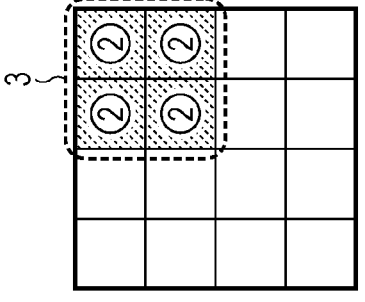
Figure 5A:
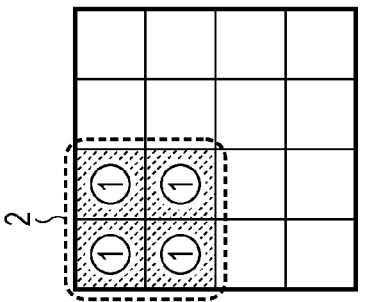
Figure 5H:
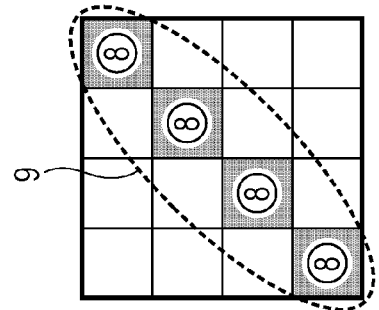

In the multiple sampling process performed on the readout pixel group illustrated in FIG. 5A, the following operations are performed:

(1) The charge signals of the pixels having pixel numbers of 1, 2, 5, and 6 (refer to the pixel numbers in FIG. 4) of the R image sensing device are read out, (2) The charge signals of the four pixels are summed, and (3) The resultant signal is AD-converted by the ADC.

In this manner, a first digital signal of the R image at t=1 is generated. Similarly, in the multiple sampling process performed on the readout pixel group illustrated in FIG. 5B, the following operations are performed:

(1) The charge signals of the pixels having pixel numbers of 3, 4, 7, and 8 (refer to the pixel numbers in FIG. 4) of the R image sensing device are read out, (2) The charge signals of the four pixels are summed, and (3) The resultant signal is AD-converted by the ADC.

In this manner, a second digital signal of the R image at t=1 is generated. In the multiple sampling process performed on the readout pixel group illustrated in FIG. 5C, the following operations are performed:

(1) The charge signals of the pixels having pixel numbers of 9, 10, 13, and 14 (refer to the pixel numbers in FIG. 4) of the R image sensing device are read out, (2) The charge signals of the four signals are summed, and (3) The resultant signal is AD-converted by the ADC.

In this manner, a third digital signal of the R image at t=1 is generated. In the multiple sampling process performed on the readout pixel group illustrated in FIG. 5D, the following operations are performed:

(1) The charge signals of the pixels having pixel numbers of 11, 12, 15, and 16 (refer to the pixel numbers in FIG. 4) of the R image sensing device are read out, (2) The charge signals of the four pixels are summed, and (3) The resultant signal is AD-converted by the ADC.

In this manner, a fourth digital signal of the R image at t=1 is generated. A similar operation is performed in the multiple sampling process performed on the readout pixel group illustrated in each of FIGS. 5E to 5H. In the multiple sampling process performed on the readout pixel group illustrated in FIG. 5E, a fifth digital signal of the R image at t=1 is generated from the signals of the pixels having pixel numbers of 1, 6, 11, and 16. In the multiple sampling process performed on the readout pixel group illustrated in FIG. 5F, a sixth digital signal of the R image at t=1 is generated from the signals of the pixels having pixel numbers of 3, 8, 9, and 14. In the multiple sampling process performed on the readout pixel group illustrated in FIG. 5G, a seventh digital signal of the R image at t=1 is generated from the signals of the pixels having pixel numbers of 2, 5, 12, and 15. In the multiple sampling process performed on the readout pixel group illustrated in FIG. 5H, an eighth digital signal of the R image at t=1 is generated from the signals of the pixels having pixel numbers of 4, 7, 10, and 13.

As described above, the charge signals of the 4-by-4 (=16) pixels are compressed into 8 digital signals. Since the data input to an analog-to-digital converter 105 (described below) (refer to, for example, FIG. 10) are compressed in this manner, the analog-to-digital converter 105 can reduce the operating speed and, thus, can reduce its consumption power, increase the S/N ratio, and reduce the communication bandwidth.

As described below, the multiple sampling information is used to indicate how an analog adder unit 104 and the analog-to-digital converter 105 perform the processing. More specifically, the multiple sampling information include the positions (the pixel numbers) of pixels that provide the pixel values (the charge signals) to be summed in the multiple sampling process to obtain each of the signal values of new digital signals after the multiple sampling process, gain information regarding a pixel value indicating the level of gain applied to the pixel value when being added. In addition, the multiple sampling information may include the order in which the digital signals obtained through the multiple sampling process are sent to a decoding apparatus.

For example, the multiple sampling information can be generated in the form of encoded data by expressing a pixel that provides the pixel value to be added in the analog multiple process as "1" and a pixel that does not provide the pixel value as "0" and, thereafter, arranging the values "0" or "1" in the order of the pixel numbers. More specifically, the multiple sampling information can be expressed as data encoded in the order illustrated in FIG. 4, as follows:

first digital signal: "1100 1100 0000 0000"
second digital signal: "0011 0011 0000 0000"
third digital signal: "0000 0000 1100 1100"
fourth digital signal: "0000 0000 0011 0011"
fifth digital signal: "1000 0100 0010 0001"
sixth digital signal: "0010 0001 1000 0100"
seventh digital signal: "0100 1000 0001 0010"
eighth digital signal: "0001 0010 0100 1000".

By concatenating these data, the multiple sampling information for the R image at t=1 is obtained as follows: "1100 1100 0000 0000 0011 0011 0000 0000 0000 0000 1100 1100 0000 0000 0011 0011 1000 0100 0010 0001 0010 0001 1000 0100 0100 1000 0001 0010 0001 0010 0100 1000".

At that time, the captured image and an multiple sampling output signal are expressed in the form of a vector. Let x denote a captured image vector in which the pixel values of the captured image are arranged in the order of pixel numbers illustrated in FIG. 4. Let y denote a digital signal vector in which first to eighth multiple sampling output signals are arranged. Then, the following expression is obtained:

$y = S \cdot x$ where the matrix S is a sampling matrix.

For example, a sampling matrix $S_R$ indicating the above-described multiple sampling information for the R image at t=1 can be given as follows:

$$S_R = \begin{bmatrix} 1 & 1 & 0 & 0 & 1 & 1 & 0 & 0 & 0 & 0 & 0 & 0 & 0 & 0 & 0 & 0 \\ 0 & 0 & 1 & 1 & 0 & 0 & 1 & 1 & 0 & 0 & 0 & 0 & 0 & 0 & 0 & 0 \\ 0 & 0 & 0 & 0 & 0 & 0 & 0 & 0 & 1 & 1 & 0 & 0 & 1 & 1 & 0 & 0 \\ 0 & 0 & 0 & 0 & 0 & 0 & 0 & 0 & 0 & 1 & 1 & 0 & 0 & 1 & 1 \\ 1 & 0 & 0 & 0 & 0 & 1 & 0 & 0 & 0 & 0 & 1 & 0 & 0 & 0 & 0 & 1 \\ 0 & 0 & 1 & 0 & 0 & 0 & 0 & 1 & 1 & 0 & 0 & 0 & 0 & 1 & 0 & 0 \\ 0 & 1 & 0 & 0 & 1 & 0 & 0 & 0 & 0 & 0 & 1 & 0 & 0 & 0 & 1 & 0 \\ 0 & 0 & 0 & 1 & 0 & 0 & 1 & 0 & 0 & 1 & 0 & 0 & 1 & 0 & 0 & 0 \end{bmatrix}$$

Similarly, when each of FIGS. 6A to 6H illustrates which pixels provide the charge signals to be summed in order to obtain one of the eight digital signals for the G image at t=1, a sampling matrix $S_G$ for the G image at t=1 can be given as follows:

$$S_G = \begin{bmatrix} 1 & 1 & 0 & 0 & 1 & 1 & 0 & 0 & 0 & 0 & 0 & 0 & 0 & 0 & 0 & 0 \\ 0 & 0 & 1 & 1 & 0 & 0 & 1 & 1 & 0 & 0 & 0 & 0 & 0 & 0 & 0 & 0 \\ 0 & 0 & 0 & 0 & 0 & 0 & 0 & 0 & 1 & 1 & 0 & 0 & 1 & 1 & 0 & 0 \\ 0 & 0 & 0 & 0 & 0 & 0 & 0 & 0 & 0 & 1 & 1 & 0 & 0 & 1 & 1 \\ 0 & 1 & 0 & 0 & 0 & 0 & 1 & 1 & 0 & 0 & 0 & 0 & 0 & 1 & 0 \\ 0 & 0 & 1 & 0 & 1 & 0 & 0 & 0 & 0 & 0 & 1 & 0 & 1 & 0 & 0 \\ 0 & 0 & 0 & 1 & 0 & 1 & 0 & 0 & 0 & 0 & 1 & 0 & 1 & 0 & 0 & 0 \\ 1 & 0 & 0 & 0 & 0 & 0 & 1 & 0 & 0 & 1 & 0 & 0 & 0 & 0 & 0 & 1 \end{bmatrix}$$

Similarly, when each of FIGS. 7A to 7H illustrates which pixels provide the charge signals to be summed in order to obtain one of the eight digital signals for the B image at t=1, a sampling matrix $S_B$ for the B image at t=1 can be given as follows:

$$S_B = \begin{bmatrix} 1 & 1 & 0 & 0 & 1 & 1 & 0 & 0 & 0 & 0 & 0 & 0 & 0 & 0 & 0 & 0 \\ 0 & 0 & 1 & 1 & 0 & 0 & 1 & 1 & 0 & 0 & 0 & 0 & 0 & 0 & 0 & 0 \\ 0 & 0 & 0 & 0 & 0 & 0 & 0 & 0 & 1 & 1 & 0 & 0 & 1 & 1 & 0 & 0 \\ 0 & 0 & 0 & 0 & 0 & 0 & 0 & 0 & 0 & 1 & 1 & 0 & 0 & 1 & 1 \\ 1 & 0 & 0 & 0 & 0 & 0 & 1 & 0 & 1 & 0 & 0 & 0 & 0 & 1 & 0 \\ 0 & 0 & 1 & 0 & 0 & 1 & 0 & 0 & 1 & 0 & 0 & 0 & 0 & 0 & 0 & 1 \\ 0 & 1 & 0 & 0 & 0 & 0 & 1 & 0 & 0 & 0 & 0 & 1 & 1 & 0 & 0 & 0 \\ 0 & 0 & 0 & 1 & 1 & 0 & 0 & 0 & 0 & 0 & 1 & 0 & 0 & 1 & 0 & 0 \end{bmatrix}$$

Through the above-described multiple sampling process, the charge signals of 16 pixels can be compressed into 8 digital signals for each of the R image, the G image, and the B image.

The image reconstruction process is described next.

FIG. 8 is a block diagram illustrating the functions of the image reconstruction circuit 15 in detail.

The image reconstruction circuit 15 includes a receiving unit 108 and an image reconstruction unit 109.

The receiving unit 108 is in the form of a connection terminal, such as a connector. The receiving unit 108 receives a digital signal output from each of the ADCs 14. The receiving unit 108 further receives the compressed sensing information and/or the multiple sampling information from the control circuit 13 (not illustrated in FIG. 8). The receiving unit 108 corresponds to the I/F 154 illustrated in FIG. 3.

The image reconstruction unit 109 is realized by the CPU 151 illustrated in FIG. 3 and executing the computer program 155. Note that instead of realizing the image reconstruction unit 109 by the CPU 151 executing the computer program 155, a signal processing circuit (hardware) having the same function may be provided.

The image reconstruction unit 109 reconstructs the R image, the G image, and the B image using the digital signal of the R image, the digital signal of the G image, and the digital signal of the B image output from the ADCs of three image sensing devices and the multiple sampling information set by an multiple sampling information setting unit 103.

In the reconstruction process, an existing technique is employed in which a repeated structure of an image is extracted using the local similarity of an image, which is prior knowledge, and is used as priori information (referred to, for example, Non-Patent Literature 1). However, the technique used in the reconstruction process is not limited thereto. For example, any one of the following three techniques that are widely used in compressed sensing may be employed:

the Improved Iterative Curvelet Thresholding technique described in, for example, J. Ma, "Improved Iterative Curvelet Thresholding for Compressed Sensing and Measurement", IEEE Transactions on Instrumentation and Measurement, vol. 60, no. 1, pp. 126-136, 2011, the Affine Scaling technique described in, for example, Toshihide Ibaraki, Masao Fukushima, "Information Mathematics Course Vol. 14 (of 15) Optimization Method", first edition published by Kyoritsu Shuppan Co., Ltd, pp. 159-164, Jul. 20, 1993, and the Alternating Direction Method of Multipliers technique described in, for example, M. V. Afonso, J. M. Bioucas-Dias and M. A. T. Figueiredo, "Fast Image Recovery Using Variable Splitting and Constrained Optimization", IEEE Transactions on Image Processing, Vol. 19, No. 9, pp. 2345-2356, 2010.

It is known that color channels in natural images have a correlation with one another. As described below, by changing multiple sampling among different color channels, the quality of a reconstructed image can be improved.

The multiple sampling process and the image reconstruction process are performed in a manner as described above.

FIG. 9 is a block diagram of the configuration of the imaging system 10 according to the present exemplary embodiment. The imaging system 10 includes an imaging apparatus 20 and a decoding apparatus 30. The imaging apparatus 20 encodes an image signal obtained as a result of an image capturing operation and outputs the encoded image signal. The decoding apparatus 30 decodes and reconstructs an image using the encoded image signal sent from the imaging apparatus 20.

The imaging apparatus 20 includes an information acquiring apparatus 40 that acquires an R image, a G image, and a B image, an encoding apparatus 50, an information accumulating apparatus 52, and a transmission circuit 54.

The information acquiring apparatus 40 includes three image sensing devices for acquiring an R image, a G image, and a B image. Each of the image sensing devices includes a photoelectric conversion unit 101 and a charge holding unit 102. The photoelectric conversion unit 101 and the charge holding unit 102 correspond to the image sensing device 11 illustrated in FIG. 1.

The encoding apparatus 50 corresponds to the multiplexer 12, the control circuit 13, and the ADC 14 illustrated in FIG. 1.

The information accumulating apparatus 52 is a secondary storage device that accumulates the digital signal encoded by the encoding apparatus 50 and the compressed sensing information and/or the multiple sampling information. The information accumulating apparatus 52 is formed from, for example, a hard disk drive, a solid-state drive, an optical drive, and/or a flash memory device. A recording medium used by the information accumulating apparatus 52 to accumulate information may be fixed to the information accumulating apparatus 52 or may be removably mounted in the information accumulating apparatus 52.

The transmission circuit 54 is a communication circuit for transmitting, to the decoding apparatus 30, the digital signal and the compressed sensing information and/or the multiple sampling information. The transmission circuit 54 may communicate with the decoding apparatus 30 via wireless or wired connection. Examples of a transmission band required for the communication are described below. In this case, the number of pixels of each of the image sensing devices is known as 8K4K (7680 pixels horizontally×4320 pixels vertically). The Y component is quantized to 12 bits using YUV422, and images are captured at a rate of 60 frames/sec. If the compressed sensing is not performed, a transmission band of 24 Gbps is needed. In contrast, if the compressed sensing is performed to compress data, the transmission band can be reduced to up to 3 Gbps. That is, in wireless or wired connection between the transmission circuit 54 and the decoding apparatus 30, it is sufficient to ensure a data rate of 3 Gbps.

The decoding apparatus 30 corresponds to the image reconstruction circuit 15 illustrated in FIG. 1.

Note that the information accumulating apparatus 52 may be included in the encoding apparatus 50. To perform recording, the other compression coding techniques may be employed in an integrated manner. It is only required to send, to the decoding apparatus 30, the digital data of the image and the multiple sampling information read out from a recording medium. The example of the configuration also applies to the following exemplary embodiments.

The decoding apparatus 30 can reconstruct the image from the digital signal using the digital signal and the compressed sensing information and/or the multiple sampling information accumulated in the information accumulating apparatus 52 later. That is, the compressed sensing and the reconstruction process need not be performed in real time. For example, if the digital signal and the compressed sensing information and/or the multiple sampling information are accumulated in an optical disk or a flash memory, which is portable, by the information accumulating apparatus 52, the decoding apparatus 30 can reconstruct the image by reading out such information in a temporally or spatially different environment.

According to an aspect of the present disclosure, the imaging apparatus 20 of the imaging system 10 compresses an image signal prior to analog-to-digital conversion using the compressed sensing technique. The imaging apparatus 20 converts the analog signal into a digital signal. Thereafter, the imaging apparatus 20 accumulates the digital signal in the information accumulating apparatus 52 or outputs the digital signal to the decoding apparatus 30. The decoding apparatus 30 reconstructs the image from the digital signal.

In the compression process and the reconstruction process, the multiple sampling process has a significant impact on the image quality of a reconstructed image. Accordingly, the way to perform the multiple sampling process is very important.

In the compression process, different sampling techniques of the multiple sampling process performed on pixels are applied to an R image, a G image, and a B image. Then, the analog multiple process is performed on the charge signals held by the charge holding unit 102 for a plurality of pixels on the basis of the multiple sampling information.

In the reconstruction process, the image is reconstructed using the compressed sensing technique.

According to the present disclosure, the imaging system 10 captures images by changing the multiple sampling information so that the multiple sampling information is different for the R image, the G image, and the B image. In natural images, an R image, a G image, and a B image have a correlation with one another. Accordingly, by capturing an image in the above-described manner, the image of a higher quality can be reconstructed. In multiple, by using the multiple sampling process, the drive frequency of the ADC can be decreased. Accordingly, low power consumption, a high S/N ratio, and reduction of transfer bandwidth can be realized.

Note that although the imaging apparatus 20 is separated from the decoding apparatus 30 in FIG. 9, the imaging apparatus 20 may include the decoding apparatus 30. If at least one of the above-described advantages can be obtained by compressing an image prior to ADC, it is not always necessary to dispose the imaging apparatus 20 and the decoding apparatus 30 in different bodies.

FIG. 10 is a block diagram of the configuration of the imaging system 10 according to the present exemplary embodiment. FIG. 11 is a flowchart illustrating the procedure for a main process performed by the information acquiring apparatus 40 and the encoding apparatus 50 according to the present exemplary embodiment. Note that for simplicity, the information accumulating apparatus 52 is not illustrated in FIG. 10. In reality, the information accumulating apparatus 52 can be included in FIG. 10. The information accumulating apparatus 52 is provided so as to accumulate information that is the same as the information output from the transmission circuit 54.

The information acquiring apparatus 40 includes the photoelectric conversion unit 101 in the image sensing device for each of an R image, a G image, and a B image and the charge holding unit 102.

The encoding apparatus 50 includes an multiple sampling unit 60, the multiple sampling information setting unit 103, and a color correlation determination unit 106. The multiple sampling unit 60 includes the analog adder unit 104 and the analog-to-digital converter 105.

The decoding apparatus 30 includes the receiving unit 108, the image reconstruction unit 109, and an output unit 110.

The transmission circuit 54 of the encoding apparatus 50 and the receiving unit 108 of the decoding apparatus 30 perform communication to send and receive digital signals of an R image, a G image, and a B image which are output signals of the analog-to-digital converter 105 and the multiple sampling information used during compressed sensing image capturing. The communication is performed via a wireless or wired communication line (a wireless or wired communication network).

Figure 12:
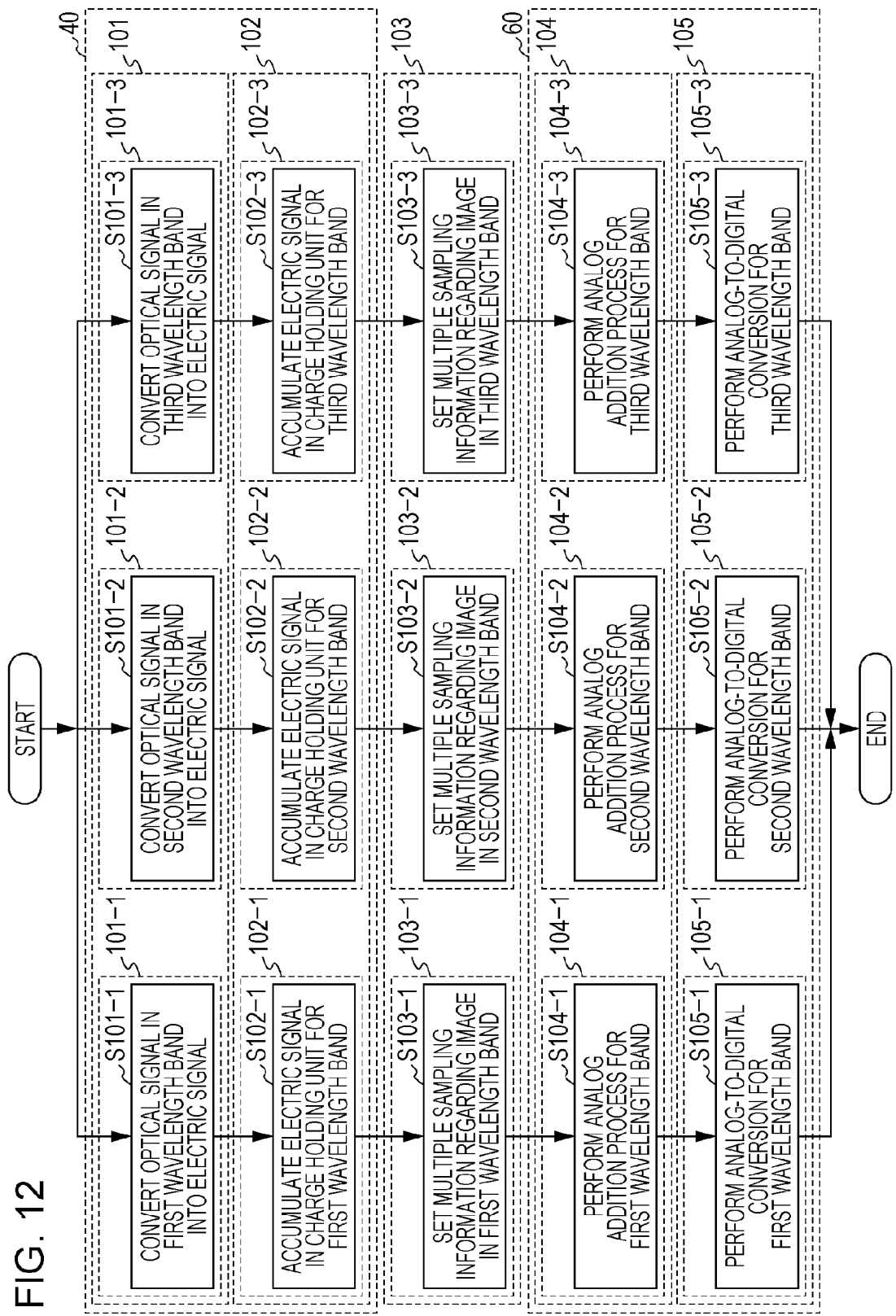
FIG. 12 is a flowchart separately describing the processes performed by the constituent elements of the information acquiring apparatus and the encoding apparatus for an R image, a G image, and a B image.

The operations performed by the constituent elements of the information acquiring apparatus 40 and the encoding apparatus 50 are described below with reference to FIG. 11. In the following description, the processes in steps S101 to S105 are separately performed for each of an R image, a G image, and a B image. However, for simplicity, each step is described for the R image, the G image, and the B image at the same time. FIG. 12 is a flowchart separately describing the processes performed for the R image, the G image, and the B image.

The process performed by the information acquiring apparatus 40 is described in detail first.

The photoelectric conversion unit 101 for each of the R image, the G image, and the B image includes a plurality of pixels. Each of the pixels converts a received light ray into an electric signal in accordance with the intensity of the received light ray. Thus, R image information (the image data of the R image), B image information (the image data of the B image), or G image information (the image data of the G image) is obtained (step S101). The plurality of pixels are provided by two-dimensionally arranging photoelectric conversion elements, such as photodiodes.

The charge holding unit 102 for each of the R image, the G image, and the B image accumulates the electric signal obtained by the photoelectric conversion unit 101 for a certain period of time and holds the electric signal in the form of a charge signal (step S102). This operation can be performed by providing a memory used to hold electrical charge for each of the pixels.

The encoding apparatus 50 is described in detail next.

The multiple sampling information setting unit 103 (hereinafter simply referred to as a "setting unit") sets up the multiple sampling information so that the multiple sampling process is performed by the analog adder unit 104 and the analog-to-digital converter 105 on the basis of the following two standards (step S103):

standard 1. sampling the pixel values of pixels located at the same positions in the image sensing device for the R image, the image sensing device for the G image, and the image sensing device for the B image in order to calculate the color correlation among the captured images, and standard 2. sampling the pixel values of pixels located at different positions in the image sensing device for the R image, the image sensing device for the G image, and the image sensing device for the B image in order to improve the image quality of the reconstructed image.

In FIGS. 5A to 5H, FIGS. 6A to 6H, and FIGS. 7A to 7H, first to fourth digital signals (a) to (d) represent the multiple sampling information set in accordance with the standard 1, and fifth to eighth digital signals (e) to (h) represent the multiple sampling information set in accordance with the standard 2.

The analog adder unit 104 performs the analog multiple process on a plurality of the charge signals held by the charge holding units 102 of the image sensing device (the information acquiring apparatus 40) for the R image, the image sensing device (the information acquiring apparatus 40) for the G image, and the image sensing device (the information acquiring apparatus 40) for the B image on the basis of the multiple sampling information set up by the multiple sampling information setting unit 103. Thus, the analog adder unit 104 generates new signals and outputs the generated signals (step S104).

The analog-to-digital converter 105 converts the signal generated by the analog adder unit 104 for each of the R image, the G image, and the B image into a digital signal (step S105). This process may be performed using the above-described ΔΣ type ADC or a widely used pipeline type or column type analog-to-digital converter.

By performing the multiple sampling process using the analog adder unit 104, the image information can be compressed and, thus, the amount of signals transmitted to the analog-to-digital converter 105, that is, the amount of signals that the analog-to-digital converter 105 needs to process can be reduced. By using the multiple sampling information used during image capturing, the image reconstruction unit 109 can reconstruct the image from the compressed image information.

The color correlation determination unit 106 calculates the color correlation in an image being captured (step S106). More specifically, the color correlation determination unit 106 calculates the color correlation using the information obtained in accordance with the above-described standard 1 for the multiple sampling information. As illustrated in FIGS. 5A to 5H, FIGS. 6A to 6H, and FIGS. 7A to 7H, the first digital signal of the R image, the first digital signal of the G image, and the first digital signal of the B image are subjected to multiple sampling using the pixel values of pixels located at the same positions in the image sensing device for the R image, the image sensing device for the G image, and the image sensing device for the B image. Similarly, the second digital signal of the R image, the second digital signal of the G image, and the second digital signal of the B image are subjected to multiple sampling using the pixel values of pixels located at the same positions in the image sensing device for the R image, the image sensing device for the G image, and the image sensing device for the B image. Similarly, the third digital signal of the R image, the third digital signal of the G image, and the third digital signal of the B image are subjected to multiple sampling using the pixel values of pixels located at the same positions in the image sensing device for the R image, the image sensing device for the G image, and the image sensing device for the B image. Similarly, the fourth digital signal of the R image, the fourth digital signal of the G image, and the fourth digital signal of the B image are subjected to multiple sampling using the pixel values of pixels located at the same positions in the image sensing device for the R image, the image sensing device for the G image, and the image sensing device for the B image. The color correlation determination unit 106 calculates the color correlation from these digital signals.

More specifically, the color correlation determination unit 106 determines that the color correlation in a target block is high if the following conditions are satisfied:

$$\frac{\left|\sum_{i=1}^{4}(R_i-\overline{R})(G_i-\overline{G})\right|}{\sqrt{\sum_{i=1}^{4}(R_i-\overline{R})^2}\sqrt{\sum_{i=1}^{4}(G_i-\overline{G})^2}} \geq Th_{IC} \text{ and}$$

$$\frac{\left|\sum_{i=1}^{4}(R_i-\overline{R})(B_i-\overline{B})\right|}{\sqrt{\sum_{i=1}^{4}(R_i-\overline{R})^2}\sqrt{\sum_{i=1}^{4}(B_i-\overline{B})^2}} \geq Th_{IC} \text{ and}$$

$$\frac{\left|\sum_{i=1}^{4}(G_i-\overline{G})(B_i-\overline{B})\right|}{\sqrt{\sum_{i=1}^{4}(G_i-\overline{G})^2}\sqrt{\sum_{i=1}^{4}(B_i-\overline{B})^2}} Th_{IC}$$

where $R_1$, $R_2$, $R_3$, and $R_4$ denote the first to fourth digital signals of the R image, respectively, $G_1$, $G_2$, $G_3$, and $G_4$ denote the first to fourth digital signals of the G image, respectively, $B_1$, $B_2$, $B_3$, and $B_4$ denote the first to fourth digital signals of the B image, respectively, and R, G, B with an upper bar denote the average signals given as follows:

$$\overline{R}=\frac{1}{4}\sum_{i=1}^{4}(R_i),\ \overline{G}=\frac{1}{4}\sum_{i=1}^{4}(G_i),\ \overline{B}=\frac{1}{4}\sum_{i=1}^{4}(B_i).$$

The technique for calculating the color correlation is not limited to the above-described technique. For example, the R image, the G image, and the B image may be converted into the YUV space, and the color correlation may be calculated using the U and V values. In such a case, the color correlation is given as follows:

$$\frac{\left|\sum_{i=1}^{4}(U_i-\overline{U})(V_i-\overline{V})\right|}{\sqrt{\sum_{i=1}^{4}(U_i-\overline{U})^2}\sqrt{\sum_{i=1}^{4}(V_i-\overline{V})^2}} \geq Th_{IC}$$

where $$\overline{U}=\frac{1}{4}\sum_{i=1}^{4}(U_i),\ \overline{V}=\frac{1}{4}\sum_{i=1}^{4}(V_i),$$

$$U_i=-0.14713\times R_i-0.28886\times G_i+0.436\times B_i,$$

$$V_i=0.615\times R_i-0.51499\times G_i-0.10001\times B_i.$$

The setting unit 103 sets up the multiple sampling information using the result of estimation made by the color correlation determination unit 106 (step S107).

Figure 13:
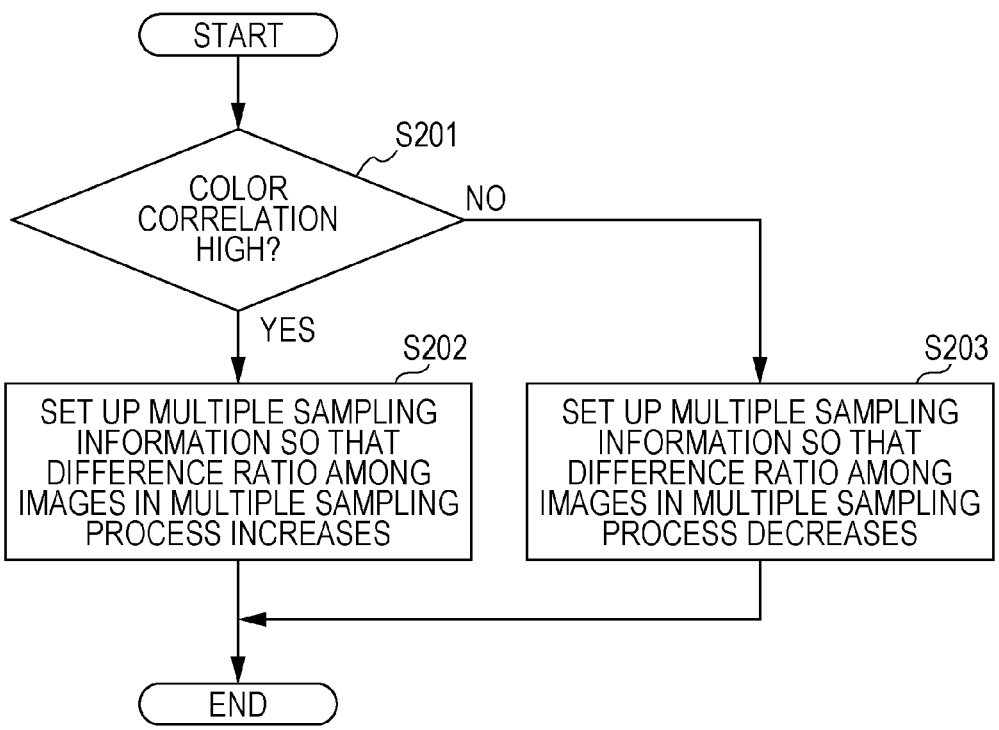
FIG. 13 is a flowchart illustrating the procedure for the main process performed by a multiple sampling information setting unit (a setting unit)
Figure 18A:
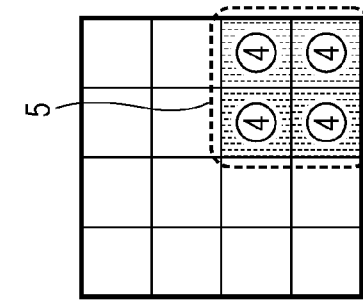
FIGS. 18A to 18H illustrate exemplary multiple sampling information set for the R image.
Figure 18B:
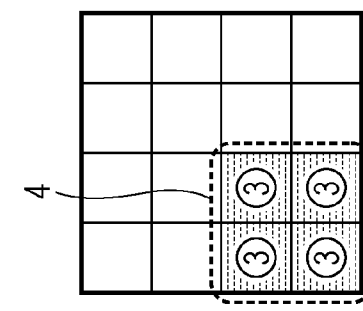
Figure 18C:
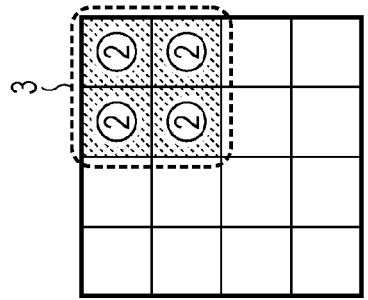
Figure 18D:
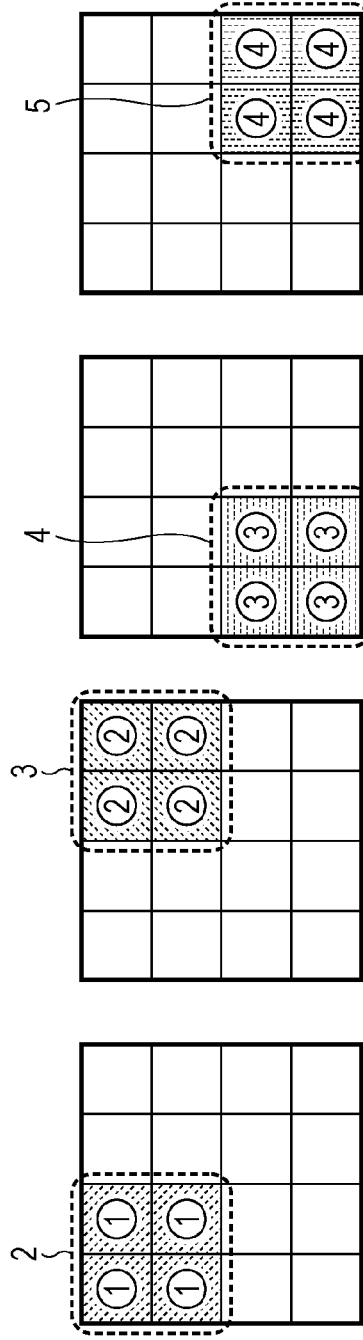
Figure 18E:
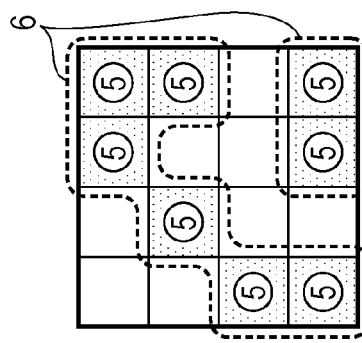
Figure 18F:
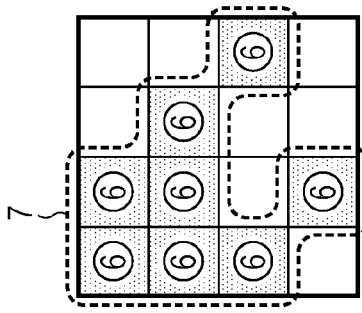
Figure 18G:
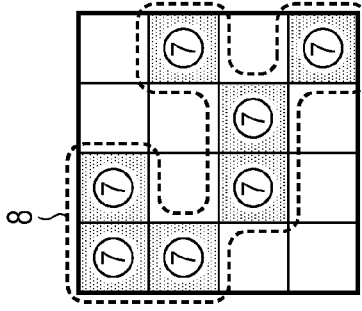
Figure 18H:
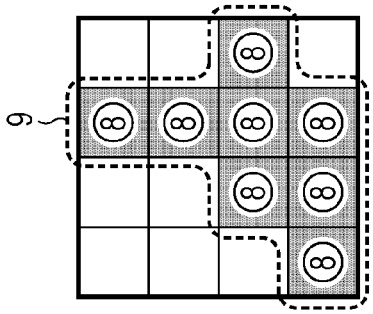
Figure 20B:
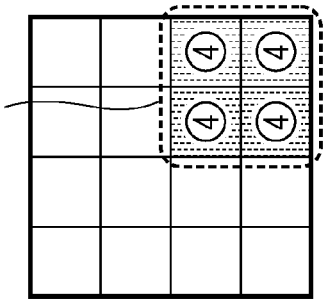
Figure 20D:
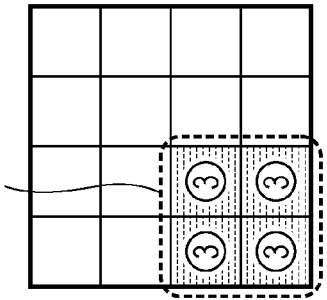
Figure 20A:
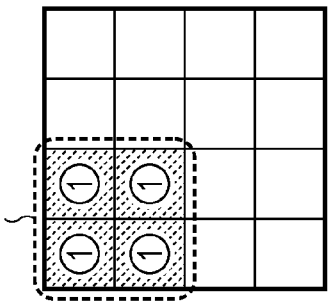
Figure 20H:
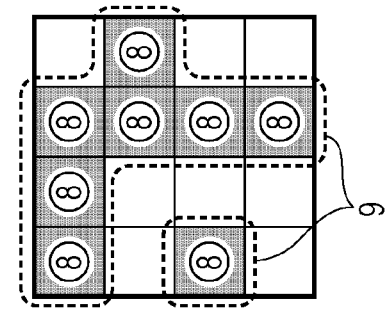
Figure 20F:
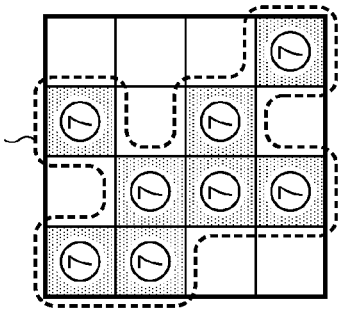
Figure 20G:
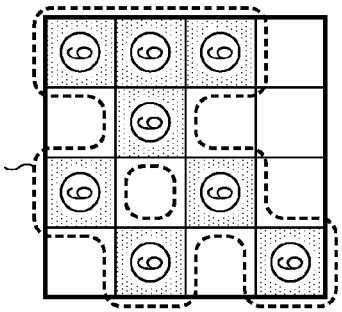
Figure 20E:
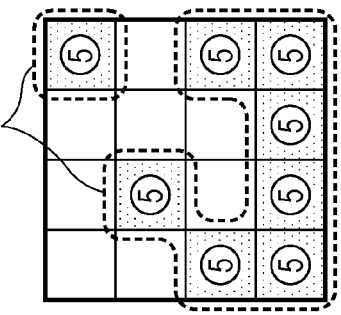

FIG. 13 is a flowchart illustrating the procedure for the main process performed by the setting unit 103. The setting unit 103 determines whether the color correlation exists in a subject using the result of determination made by the color correlation determination unit 106 (step S201). If the color correlation value is higher than or equal to a threshold value (Yes in step S201), it is determined that the color correlation exists in the subject. Thus, the setting unit 103 sets up the multiple sampling information so that the level of difference (the difference ratio) among the R image, the G image, and the B image in the multiple sampling process increases (step S202). For example, the multiple sampling information about the R image may be set to that illustrated in FIGS. 5A to 5H, the multiple sampling information about the G image may be set to that illustrated in FIGS. 6A to 6H, and the multiple sampling information about the B image may be set to that illustrated in FIGS. 7A to 7H. Note that if the multiple sampling information is set up, the multiple sampling information is used in the subsequent multiple sampling processes. Also, note that if n is a natural number in the range from 1 to 8, at least one of the pixel positions for providing the pixel values for generating an n-th digital signal of the R image (i.e., information for identifying the pixel), at least one of the pixel positions for providing the pixel values for generating an n-th digital signal of the G image (i.e., information for identifying the pixel), and at least one of the pixel positions for providing the pixel values for generating an n-th digital signal of the B image (i.e., information for identifying the pixel) may differ from one another. In this manner, the multiple sampling process for generating the eight digital signals of the R image, the multiple sampling process for generating the eight digital signals of the G image, and the multiple sampling process for generating the eight digital signals of the B image can differ from one another among the R image, G image, and B image.

However, if the color correlation value is lower than the threshold value (No in step S201), it is estimated that the color correlation is likely not to exist in the subject. Thus, the setting unit 103 sets up the multiple sampling information so that the level of difference (the difference ratio) among the R image, the G image, and the B image in the multiple sampling process decreases (step S203). For example, the multiple sampling information about all the R image, G image, and B image may be set to that illustrated in FIGS. 5A to 5H (if n is a natural number in the range from 1 to 8, a plurality of the pixel positions for providing a plurality of pixel values for generating an n-th digital signal of the R image (i.e., information for identifying the pixels), a plurality of the pixel positions for providing a plurality of pixel values for generating an n-th digital signal of the G image (i.e., information for identifying the pixels), and a plurality of the pixel positions for providing a plurality of pixel values for generating an n-th digital signal of the B image (i.e., information for identifying the pixels) are set to the same positions). As described above, by using the color correlation information in this manner, optimum multiple sampling information can be set and, thus, the image having a higher image quality can be reconstructed.

Note that if the color correlation determination unit 106 determines that the color correlation value is higher than the threshold value (Yes in step S201), the multiple sampling information setting unit 103 may set the multiple sampling information so that the level of difference among the multiple sampling processes is high, instead of changing the multiple sampling processes for the R image, the G image, and the B image from one another. For example, the multiple sampling information setting unit 103 may set the multiple sampling information regarding the R image to that illustrated in FIGS. 5A to 5H, set the multiple sampling information regarding the G image to that illustrated in FIGS. 14A to 14H, and set the multiple sampling information regarding the B image to that illustrated in FIGS. 15A to 15H.

Note that for simplicity, the dotted line surrounding each of the readout pixel groups as illustrated in FIGS. 5A to 5H is not illustrated in FIGS. 14A to 14H, FIGS. 15A to 15H, FIGS. 16A to 16H, FIGS. 17A to 17H, FIGS. 18A to 18H, FIGS. 19A to 19H, and FIGS. 20A to 20H. The pixels with the same circled number form a readout pixel group. The readout pixel groups are identified by reference numerals 2 to 9.

Similarly, if the color correlation determination unit 106 determines that the color correlation value is lower than or equal to the threshold value (No in step S201), the multiple sampling information setting unit 103 may set the multiple sampling information so that the level of difference among the multiple sampling processes is low, instead of setting the multiple sampling processes for the R image, the G image, and the B image to be the same. For example, the multiple sampling information setting unit 103 may set the multiple sampling information regarding the R image to that illustrated in FIGS. 5A to 5H, set the multiple sampling information regarding the G image to that illustrated in FIGS. 16A to 16H, and set the multiple sampling information regarding the B image to that illustrated in FIGS. 17A to 17H.

Alternatively, the multiple sampling information setting unit 103 may set the multiple sampling information so that more pixel values are added. In such a case, for example, the multiple sampling information setting unit 103 can set the multiple sampling information regarding the R image to that illustrated in FIGS. 18A to 18H, set the multiple sampling information regarding the G image to that illustrated in FIGS. 19A to 19H, and set the multiple sampling information regarding the B image to that illustrated in FIGS. 20A to 20H.

Still alternatively, instead of determining the color correlation value using the color correlation determination unit 106 and switching the multiple sampling information in accordance with the comparative size relationship regarding the color correlation value, the multiple sampling information setting unit 103 may select an optimum piece of multiple sampling information from among a plurality of pieces of the multiple sampling information on the basis of the color correlation value. In such a case, setting can be made so that the ratio of equality among the pieces of the multiple sampling information for the R image, the G image, and the B image is changed in accordance with the color correlation value calculated by the color correlation determination unit 106.

Figure 21:
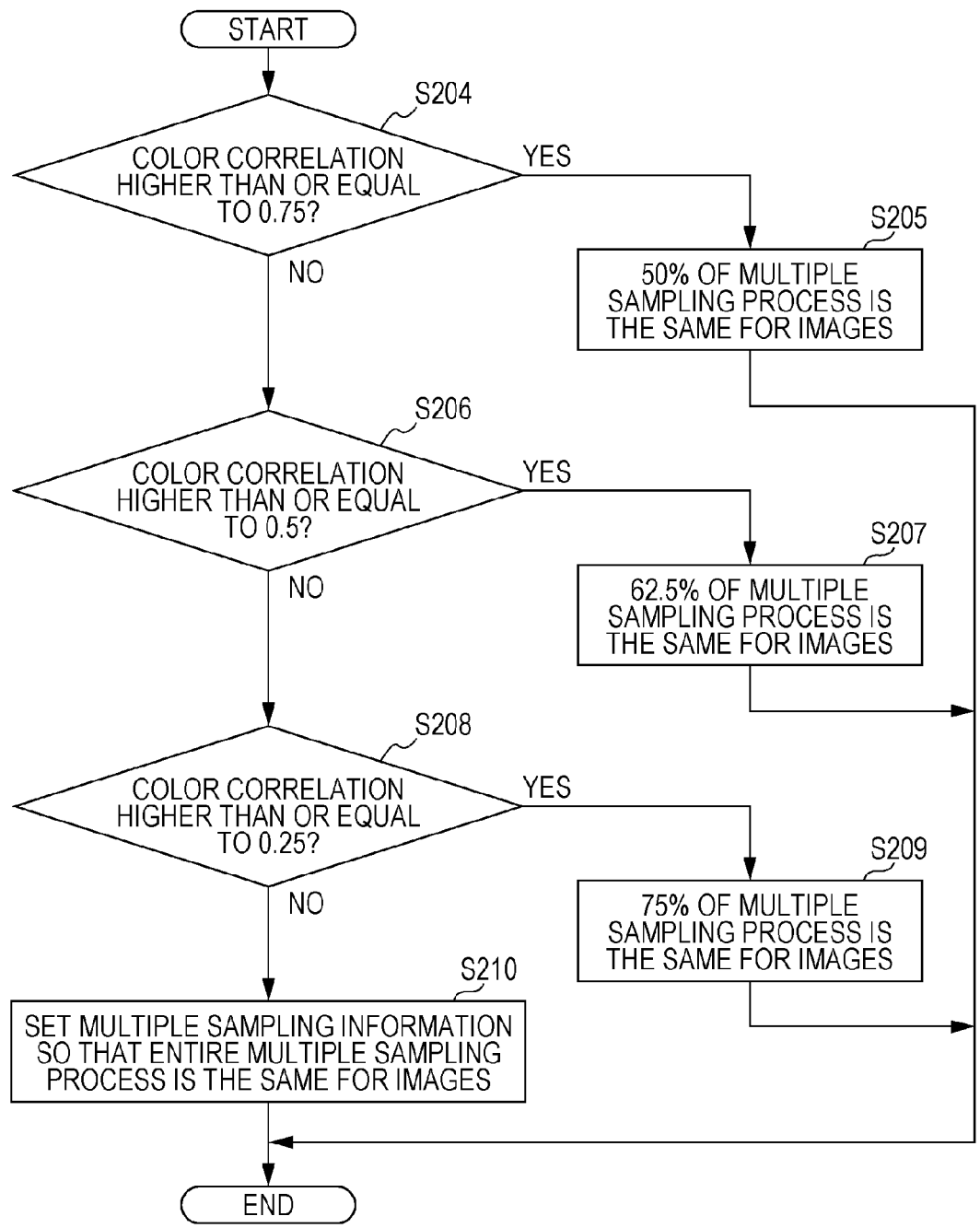
FIG. 21 is a flowchart of the procedure for the main process performed by the multiple sampling information setting unit (the setting unit)

FIG. 21 is a flowchart of the procedure for the main process performed by the setting unit 103. If the color correlation value is higher than or equal to 0.75 (Yes in step S204), the multiple sampling information is set so that 50% of the multiple sampling process is the same for the R image, the G image, and the B image (step S205). Such setting can be made by, for example, setting the multiple sampling information regarding the R image to that illustrated in FIGS. 5A to 5H, setting the multiple sampling information regarding the G image to that illustrated in FIGS. 6A to 6H, and setting the multiple sampling information regarding the B image to that illustrated in FIGS. 7A to 7H.

However, if the color correlation value is lower than 0.75 (No in step S204) and is higher than or equal to 0.5 (Yes in step S206), the multiple sampling information is set so that 62.5% of the multiple sampling process is the same for the R image, the G image, and the B image (step S207). Such setting can be made by, for example, setting the multiple sampling information regarding the R image to that illustrated in FIGS. 5A to 5H, setting the multiple sampling information regarding the G image to that illustrated in FIGS. 14A to 14H, and setting the multiple sampling information regarding the B image to that illustrated in FIGS. 15A to 15H.

However, if the color correlation value is lower than 0.5 (No in step S206) and is higher than or equal to 0.25 (Yes in step S208), the multiple sampling information is set so that 75% of the multiple sampling process is the same for the R image, the G image, and the B image (step S209). Such setting can be made by, for example, setting the multiple sampling information regarding the R image to that illustrated in FIGS. 5A to 5H, setting the multiple sampling information regarding the G image to that illustrated in FIGS. 16A to 16H, and setting the multiple sampling information regarding the B image to that illustrated in FIGS. 17A to 17H. However, if the color correlation value is lower than 0.25 (No in step S208), the multiple sampling information is set so that the entire multiple sampling process is the same for the R image, the G image, and the B image (step S210). Such setting can be made by, for example, setting all the multiple sampling information regarding the R, G, and B images to that illustrated in FIGS. 5A to 5H.

The transmission circuit 54 sends the digital signal of the image captured by the imaging apparatus 20 and the multiple sampling information used during the image capturing to the decoding apparatus 30 (step S108).

The process performed by the decoding apparatus 30 is described in detail next.

The outline of the process performed by the decoding apparatus 30 has already been described with reference to FIG. 8. The process according to the present exemplary embodiment is described in detail below.

Figure 22:
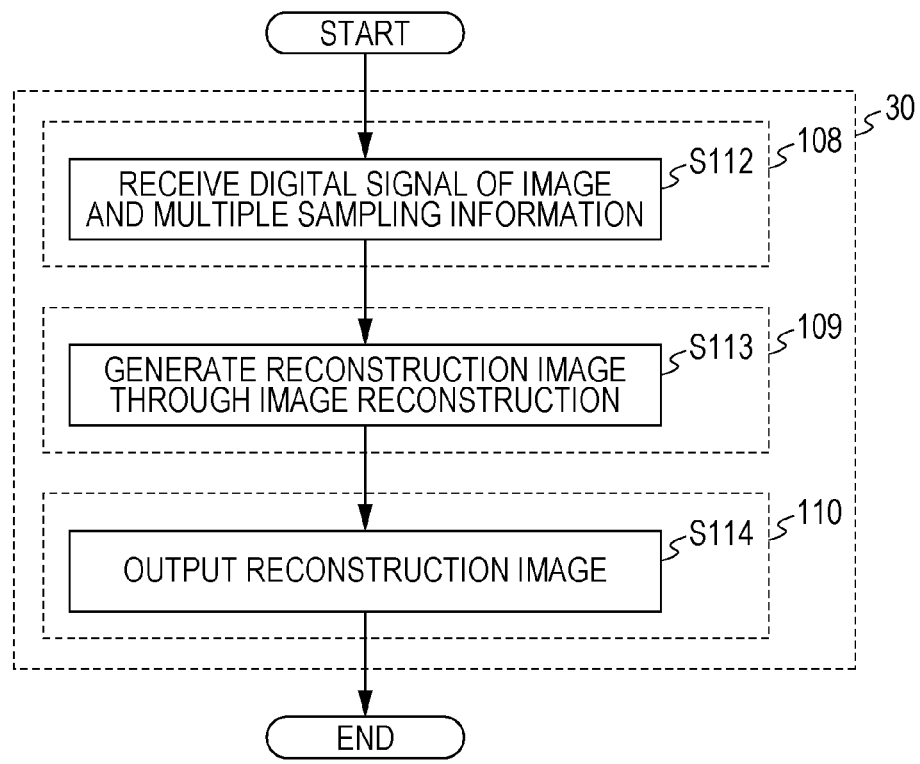
FIG. 22 is a flowchart of the procedure for the main process performed by a decoding apparatus according to an exemplary embodiment.

FIG. 22 is a flowchart of the procedure for the main process performed by the decoding apparatus 30 according to the present exemplary embodiment.

The receiving unit 108 receives the digital signal of the image sent from the transmission circuit 54 of the imaging apparatus 20, the compressed sensing information, and the multiple sampling information used during the image capturing (step S112).

The image reconstruction unit 109 reconstructs the captured image from the digital signal of the image and the multiple sampling information used during image capturing using the compressed sensing technique (step S113).

The image reconstruction process is performed by using, for example, collaborative sparsity described in Non-Patent Literature 1. This technique uses Block Matching 3D Filtering (BM3D) described in K. Dabov, A. Foi, V. Katkovnik, K. Egiazarian, "Image Denoising by Sparse 3-D Transform-Domain Collaborative Filtering", IEEE Trans Image Process., vol. 16, iss. 8, pp. 2080-2095, 2007.

BD3D is a technique to reduce noise by performing the following three processes:

1. Grouping by block-matching: dividing an image into small blocks and grouping similar blocks to generate 3D data,
2. Collaborative Filter: 3D-filtering the 3D data to obtain 3D coefficients, and removing noise by performing, for example, soft thresholding,
3. Aggregation: applying inverse 3D filtering transformation on the 3D coefficients to reconstruct each of the image blocks and, thereafter, the images are re-combined using, for example, a weighted averaging process.

In the Grouping by block-matching process, the term "similar block" is defined as follows. That is, let T(i, j) denote the pixel value of a block of interest, and let I(i, j) denote the pixel value of a reference block. Then, a similar block is defined as a block providing a small error SSD(T, I) given as:

$$SSD(T, I) = \sum_{j=0}^{N-1} \sum_{i=0}^{M-1} (T(i, j) - I(i, j))^2$$

Note that SSD stands for "Sum of Squared Differences".

The image reconstruction process using Collaborative Sparsity is based on prior knowledge that the 3D coefficient obtained from the Collaborative Filter is sparse. Accordingly, if a sufficient number of blocks that are similar to a block of interest are not present, the prior knowledge cannot be applied and, thus, the image quality of a reconstructed image decreases. The decrease in image quality easily occurs in a moving picture scene captured by a camera that is moving and a region of an image in the vicinity of an occlusion boundary captured by a light field camera, such as a multi-viewpoint image captured by the camera located at different positions.

To improve the image quality of a reconstructed image, the imaging system 10 according to the present exemplary embodiment uses a correlation between color channels. More specifically, when similar blocks are grouped, images of color channels other than the color channel of the block of interest are added. In this manner, the number of similar blocks can be increased and, thus, the image quality of a reconstructed image can be improved. For example, when the G image is reconstructed, similar blocks are grouped using the R images and B images in multiple to the G images.

Even when images of different color channels have a high correlation, the pixel values themselves differ from each other, in general. This is because although the R/G/B color filters have overlap of passbands, the wavelength characteristics differ from one another. To allow the difference between the pixel values and group a large number of similar blocks, it is necessary to perform the process using only the correlation information instead of the difference between the pixel values. Thus, the image reconstruction unit 109 of the imaging system 10 according to the present exemplary embodiment evaluates similar blocks using Normalized Cross-Correlation (NCC) instead of existing SSD between blocks.

That is, a correlation value R(T, I) can be given as follows:

$$R(T, I) = \frac{\sum_{j=0}^{N-1} \sum_{i=0}^{M-1} T(i, j) \cdot I(i, j)}{\sqrt{\sum_{j=0}^{N-1} \sum_{i=0}^{M-1} T(i, j)^2} \cdot \sqrt{\sum_{j=0}^{N-1} \sum_{i=0}^{M-1} I(i, j)^2}}$$

In this manner, more similar blocks can be grouped without being influenced by the difference among the R/G/B pixel values. Accordingly, the image quality of the reconstructed image can be improved.

Furthermore, to improve the image quality of the reconstructed image, the setting unit 103 of the imaging system 10 according to the present exemplary embodiment sets up the multiple sampling information used to sample pixels located at different positions in the R image, the G image, and the B image. If similar blocks are grouped from images having color correlation characteristics using, regions having the same positions and different color channels are easily selected. At that time, if multiple sampling is performed on pixels located at the same positions in the R image, the G image, and the B image, the amount of input data does not increase. However, if multiple sampling is performed on pixels located at different positions in the R image, the G image, and the B image, different multiple sampling is performed for each of the color channels and, thus, the amount of information in input data can be increased. This process is described in more detail below.

For simplicity, description is made with reference to an image having an R image, a G image, and a B image that are completely the same. The multiple sampling information regarding the R image, the G image, and the B image differ from each other. That is, when sampling illustrated in FIGS. 5A to 5H, FIGS. 6A to 6H, and FIGS. 7A to 7H is performed, the following relationships are given:

$$y_1 = S_H \cdot x_R$$

$$y_2 = S_G \cdot x_G$$

$$y_3 = S_B \cdot x_B$$

where $y_1$, $y_2$, and $y_3$ are expressed as follows:

$$y_1 = [y_{11} y_{12} y_{13} y_{14} y_{15} y_{16} y_{17} y_{18}]^T$$

$$y_2 = [y_{21} y_{22} y_{23} y_{24} y_{25} y_{26} y_{27} y_{28}]^T$$

$$y_3 = [y_{31} y_{32} y_{33} y_{34} y_{35} y_{36} y_{37} y_{38}]^T$$

Since $X_R = X_G = X_B = X$, Equation can be expressed as follows:

$$\begin{bmatrix} y_1 \\ y_2 \\ y_3 \end{bmatrix} = \begin{bmatrix} S_R \\ S_G \\ S_B \end{bmatrix} \cdot x$$

Furthermore, since the first to fourth digital signals are the same for R/G/B in multiple sampling illustrated in FIGS. 5A to 5H, FIGS. 6A to 6H, and FIGS. 7A to 7H, Equation can be expressed as follows:

$$\begin{bmatrix} y_{11} \\ y_{12} \\ y_{13} \\ y_{14} \\ y_{15} \\ y_{16} \\ y_{17} \\ y_{18} \\ y_{25} \\ y_{26} \\ y_{27} \\ y_{28} \\ y_{35} \\ y_{36} \\ y_{37} \\ y_{38} \end{bmatrix} = \begin{bmatrix} 1 & 1 & 0 & 0 & 1 & 1 & 0 & 0 & 0 & 0 & 0 & 0 & 0 & 0 & 0 & 0 \\ 0 & 0 & 1 & 1 & 0 & 0 & 1 & 1 & 0 & 0 & 0 & 0 & 0 & 0 & 0 & 0 \\ 0 & 0 & 0 & 0 & 0 & 0 & 0 & 0 & 1 & 1 & 0 & 0 & 1 & 1 & 0 & 0 \\ 0 & 0 & 0 & 0 & 0 & 0 & 0 & 0 & 0 & 1 & 1 & 0 & 0 & 1 & 1 \\ 1 & 0 & 0 & 0 & 1 & 0 & 0 & 0 & 0 & 1 & 0 & 0 & 0 & 0 & 0 & 1 \\ 0 & 0 & 1 & 0 & 0 & 0 & 0 & 1 & 1 & 0 & 0 & 0 & 0 & 0 & 1 & 0 \\ 0 & 1 & 0 & 0 & 1 & 0 & 0 & 0 & 0 & 0 & 1 & 0 & 0 & 1 & 0 \\ 0 & 0 & 0 & 1 & 0 & 0 & 1 & 0 & 0 & 1 & 0 & 0 & 1 & 0 & 0 & 0 \\ 0 & 1 & 0 & 0 & 0 & 0 & 1 & 1 & 0 & 0 & 0 & 0 & 0 & 1 & 0 \\ 0 & 0 & 1 & 0 & 1 & 0 & 0 & 0 & 0 & 0 & 1 & 0 & 1 & 0 & 0 \\ 0 & 0 & 0 & 1 & 0 & 1 & 0 & 0 & 0 & 0 & 1 & 0 & 1 & 0 & 0 & 0 \\ 1 & 0 & 0 & 0 & 0 & 0 & 1 & 0 & 0 & 1 & 0 & 0 & 0 & 0 & 0 & 1 \\ 1 & 0 & 0 & 0 & 0 & 0 & 0 & 1 & 0 & 1 & 0 & 0 & 0 & 0 & 1 & 0 \\ 0 & 0 & 1 & 0 & 0 & 1 & 0 & 0 & 1 & 0 & 0 & 0 & 0 & 0 & 0 & 1 \\ 0 & 1 & 0 & 0 & 0 & 0 & 1 & 0 & 0 & 0 & 0 & 1 & 1 & 0 & 0 & 0 \\ 0 & 0 & 0 & 1 & 1 & 0 & 0 & 0 & 0 & 0 & 1 & 0 & 0 & 1 & 0 & 0 \end{bmatrix} \cdot x$$

Accordingly, 16 constraint conditions can be obtained for 16 unknowns for x.

In multiple, the multiple sampling information regarding the R image, the G image, and the B image are the same. That is, if multiple sampling is performed on the R image, the G image, and the B image under the condition illustrated in FIGS. 5A to 5H, the following relational expressions are obtained:

$$y'_1 = S_R x_R$$

$$y'_2 = S_R x_G$$

$$y'_3 = S_R x_B$$

where $y'_1$, $y'_2$, and $y'_3$ are expressed as follows:

$$y'_1 = [y'_{11} y'_{12} y'_{13} y'_{14} y'_{15} y'_{16} y'_{17} y'_{18}]^T$$

$$y'_2 = [y'_{21} y'_{22} y'_{23} y'_{24} y'_{25} y'_{26} y'_{27} y'_{28}]^T$$

$$y'_3 = [y'_{31} y'_{32} y'_{33} y'_{34} y'_{35} y'_{36} y'_{37} y'_{38}]^T$$

Since $X_R = X_G = X_B = X$, Equation can be expressed as follows:

$$\begin{bmatrix} y'_1 \\ y'_2 \\ y'_3 \end{bmatrix} = \begin{bmatrix} S_R \\ S_R \\ S_R \end{bmatrix} \cdot x$$

Furthermore, since the multiple sampling information is the same for R/G/B, Equation is the same as the following Equation:

$$\begin{bmatrix} y'_{11} \\ y'_{12} \\ y'_{13} \\ y'_{14} \\ y'_{15} \\ y'_{16} \\ y'_{17} \\ y'_{18} \end{bmatrix} = \begin{bmatrix} 1 & 1 & 0 & 0 & 1 & 1 & 0 & 0 & 0 & 0 & 0 & 0 & 0 & 0 & 0 & 0 \\ 0 & 0 & 1 & 1 & 0 & 0 & 1 & 1 & 0 & 0 & 0 & 0 & 0 & 0 & 0 & 0 \\ 0 & 0 & 0 & 0 & 0 & 0 & 0 & 0 & 1 & 1 & 0 & 0 & 1 & 1 & 0 & 0 \\ 0 & 0 & 0 & 0 & 0 & 0 & 0 & 0 & 0 & 0 & 1 & 1 & 0 & 0 & 1 & 1 \\ 1 & 0 & 0 & 0 & 0 & 1 & 0 & 0 & 0 & 0 & 1 & 0 & 0 & 0 & 0 & 1 \\ 0 & 0 & 1 & 0 & 0 & 0 & 0 & 1 & 1 & 0 & 0 & 0 & 0 & 1 & 0 & 0 \\ 0 & 1 & 0 & 0 & 1 & 0 & 0 & 0 & 0 & 0 & 0 & 1 & 0 & 0 & 1 & 0 \\ 0 & 0 & 0 & 1 & 0 & 0 & 1 & 0 & 0 & 1 & 0 & 0 & 1 & 0 & 0 & 0 \end{bmatrix} \cdot x$$

That is, only 8 constraint conditions are obtained for 16 unknowns for x.

As can be seen from the above description, by setting the multiple sampling information so that the multiple sampling information regarding the R image, the G image, and the B image differ from one another, more constraint conditions can be obtained as compared with the case in which the same multiple sampling information regarding the R image, the G image, and the B image are set. A more correct solution of the unknown x can be estimated as the number of the constraint conditions increases. Accordingly, if a color correlation exists in the subject, the image quality of a reconstructed image can be improved by setting different multiple sampling information for the R image, the G image, and the B image.

The case in which a color correlation does not exist in the subject is discussed below. In the field of demosaicing, if there is no color correlation among the R image, the G image, and the B image, color shift called false color occurs in a reconstructed image. This is because sampling positions in the R image, the G image, and the B image differ from one another.

Thus, according to the present exemplary embodiment, to prevent degradation of an image quality presented to the eyes caused by color shift, the imaging system sets the same multiple sampling information for the R image, the G image, and the B image if the color correlation determination unit 106 determines that no color correlation exists in the subject.

As described above, if the color correlation determination unit 106 determines that a color correlation exists in the subject, the imaging system according to the present exemplary embodiment sets different pieces of the multiple sampling information for the R image, the G image, and the B image in order to improve the image quality of a reconstructed image. However, if the color correlation determination unit 106 determines that no color correlation exists in the subject, the imaging system sets the same multiple sampling information for the R image, the G image, and the B image in order to prevent degradation of an image quality presented to the eyes caused by color shift. In this manner, optimum multiple sampling is applied to the subject and, thus, the image quality of a reconstructed image can be improved.

The output unit 110 outputs the image reconstructed by the image reconstruction unit 109 to a liquid crystal display or a projector (step S114). Alternatively, the output unit 110 may send the reconstructed image to the outside via a wired or wireless communication network instead of displaying the image. Still alternatively, the output unit 110 may store the reconstructed image in a recording medium, such as a secure digital (SD) card or a hard disk.

In multiple, as described above, the multiple sampling information can be generated by expressing a pixel that provides the pixel value to be added in the analog multiple process as "1" and a pixel that does not provide the pixel value as "0" and, thereafter, arranging the values in the order of the pixel numbers as encoded data. As described above, the multiple sampling information regarding the R image illustrated in FIGS. 5A to 5H is expressed as follows:
"1100 1100 0000 0000 0011 0011 0000 0000 0000 0000 1100 1100 0000 0000 0011 0011 1000 0100 0010 0001 0010 0001 1000 0100 0100 1000 0001 0010 0001 0010 0100 1000".

As used herein, the above-described digit sequence is referred to as "multiple sampling information coded data" or simply "coded data". Note that the format of the multiple sampling information is not limited thereto. Any format that indicates the position of a pixel sampled for multiple can be employed. For example, data obtained by coding coded data using a widely used coding technique, such as run-length coding, may be employed as the multiple sampling information. Note that since encoded data can be sent and received without having an impact on the analog-to-digital converter of the image sensing device, the coded data need not be taken into account in compression of captured image data.

In multiple, similarly, the multiple sampling information regarding the G image illustrated in FIGS. 6A to 6H is expressed as follows:
"1100 1100 0000 0000 0011 0011 0000 0000 0000 0000 1100 1100 0000 0000 0011 0011 0100 0001 0010 1000 0010 1000 0001 0100 0001 0100 0010 1000 1000 0010 0100 0001".

Similarly, the multiple sampling information regarding the B image illustrated may be used. That is, if the color correlation determination unit 106 determines that a color correlation exists in the subject, the setting unit 103 sets the table number "1" for the R image, sets the table number "2" for the G image, and sets the table number "3" for the B image. However, if the color correlation determination unit 106 determines that no color correlation exists in the subject, the setting unit 103 sets the table number "1" for the R image, sets the table number "1" for the G image, and sets the table number "1" for the B image.

The analog adder unit 104 and the analog-to-digital converter 105 read out the pixel value of a pixel a plurality of times and performs the multiple process a plurality of times. Thus, the dynamic range of the digital signal can be increased. Accordingly, the noise can be reduced. Such an multiple sampling process is described in, for example, D. Takhar, J. N. Laska, M. B. Wakin, M. F. Durate, D. Baron, S. Sarvotham, K. F. Kelly, and R. G. Baraniuk, "A New Compressive Imaging Camera Architecture using Optical-Domain Compression", Proc. of Computational Imaging IV at SPIE Electronic Imaging, 2006.

While the above description has been made with reference to a visible light band as the wavelength band, the wavelength band used is not limited thereto. For example, an ultraviolet light band, a near-infrared light band, or a far-infrared light band may be employed. For example, if the near-infrared light band is employed, a near-infrared light image can be used as the first wavelength band image. In multiple, a red image can be used as the second wavelength band image, and a green image can be used as the third wavelength band image. In existing imaging systems, it is difficult to acquire a high-resolution near-infrared light image. In contrast, according to the present exemplary embodiment, the imaging system can acquire a high-resolution near-infrared light image from a low-resolution near-infrared light image and high-resolution red and green images by using the color correlation information.

Note that the number of the wavelength bands used to acquire a charge signal using the information acquiring apparatus 40 is not limited to three. Light rays in four or more wavelength bands may be received, and charge signals may be generated. For example, in multiple to charge signals of red, green, and blue images, a charge signal for the near-infrared wavelength band may be acquired.

Furthermore, the information acquiring apparatus 40 may acquire a plurality of images having different exposure times.

In the above-described exemplary embodiment, for example, in the imaging system 10 illustrated in FIG. 10, the color correlation determination unit 106 receives the digital signal from the multiple sampling unit 60. The color correlation value can be digitized on the basis of the digital signal. However, this technique is only an example. It is only required that the color correlation determination unit 106 can determine whether the color correlation value of a subject is lower than or equal to the threshold value. Instead of receiving a digital signal, the color correlation determination unit 106 may receive an analog signal and make determination regarding the color correlation value. In such a case, the color correlation value can be received in the form of an analog signal value. The color correlation value need not be digitized. Note that the determination process of the color correlation value on the basis of an analog signal can be performed using, for example, Equation. When Equation is used, the operation Σ is replaced by the integration operation with respect to the analog signal value.

Figure 24:
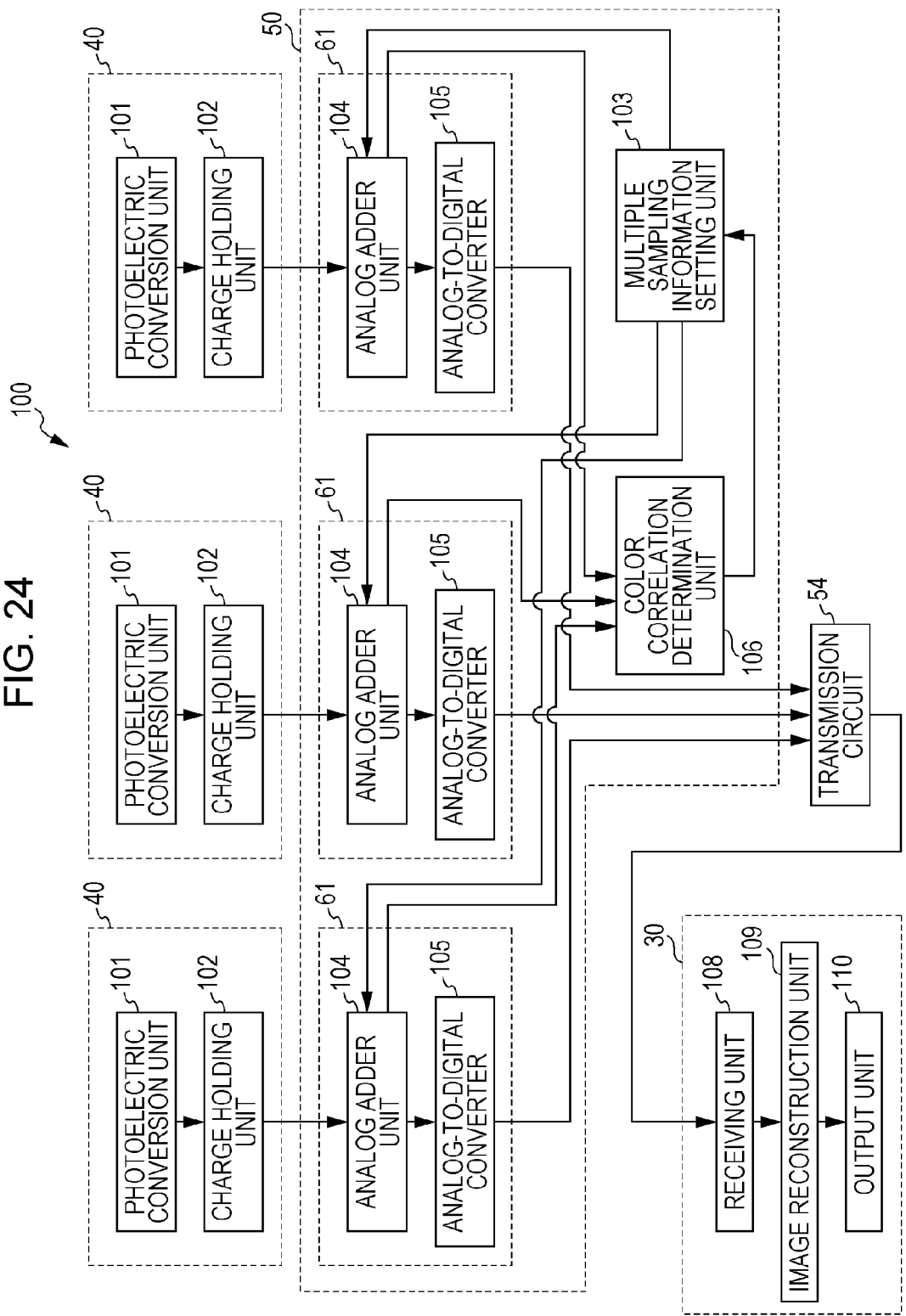
FIG. 24 illustrates the configuration of an imaging system according to a modification of the imaging system illustrated in FIG. 1.

FIG. 24 illustrates the configuration of an imaging system 100, which is a modification of the imaging system 10 (refer to FIG. 1). Unlike the imaging system 10 illustrated in FIG. 1, the imaging system 100 includes an multiple sampling unit 61 instead of the multiple sampling unit 60. The multiple sampling unit 61 sends an analog signal to the color correlation determination unit 106.

Alternatively, as another modification, the encoding apparatus 50 may further include an image capturing mode setting unit. A photographer may manually set the multiple sampling information instead of automatically setting the multiple sampling information.

Figure 25:
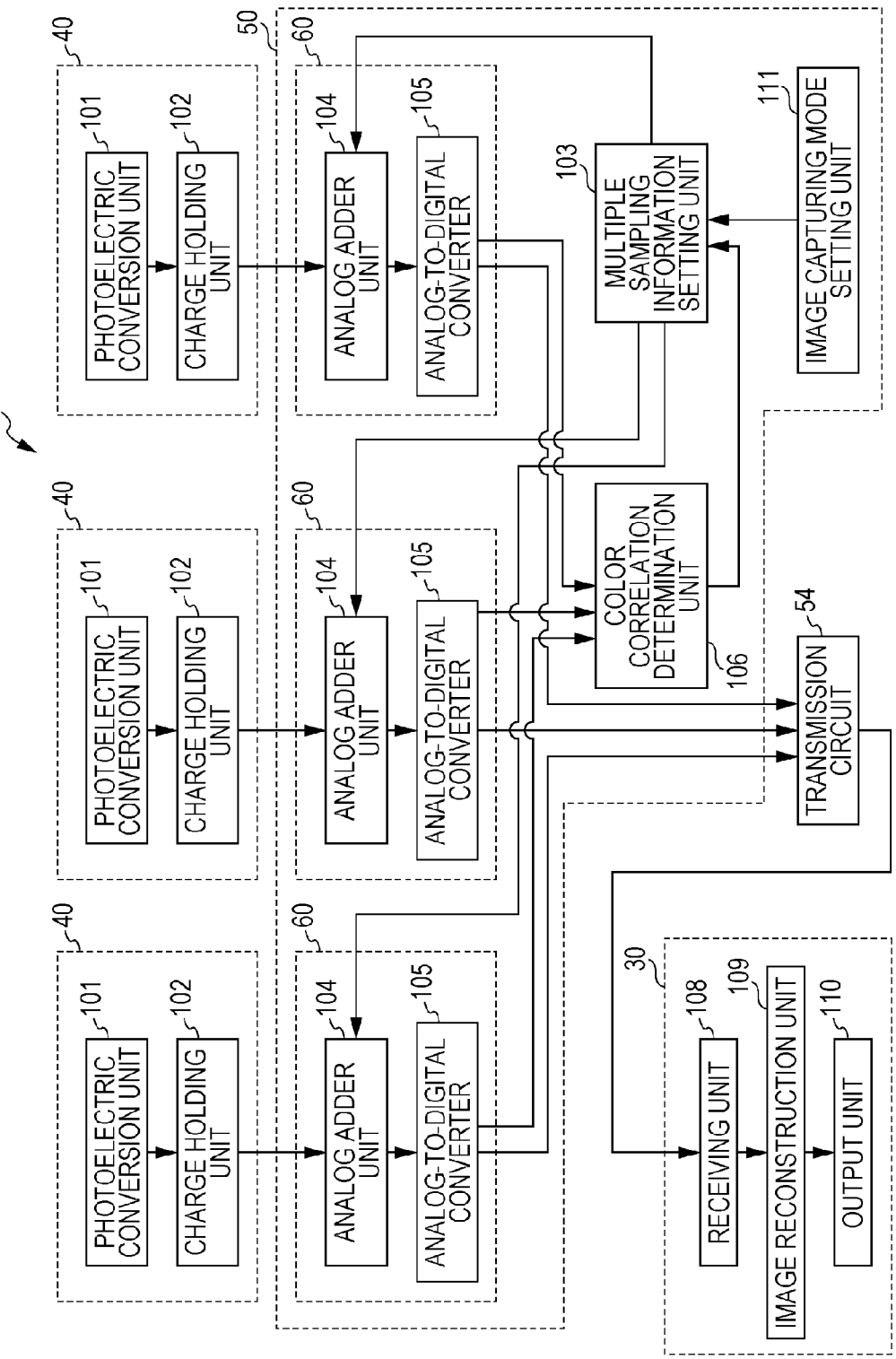
FIG. 25 is a block diagram of the configuration of the imaging system including an image capturing mode setting unit.

FIG. 25 is a block diagram of the configuration of the imaging system 100 including an image capturing mode setting unit 111. The image capturing mode setting unit 111 serves as a user interface. For example, a user may select one of the two image capturing modes "color-priority mode" and "compression ratio-priority mode". If the user selects the color-priority mode, the multiple sampling information is set so that the number of samples obtained from the pixels located at the same positions in the R image, the G image, and the B image increases in order to calculate the color correlation of the captured image (standard 1) in step S107. However, if the user selects the compression ratio-priority mode, the multiple sampling information is set so that the number of samples obtained from the pixels located at different positions in the R image, the G image, and the B image increases in order to improve the image quality of the reconstructed image (standard 2) in step S107. In this manner, the multiple sampling information that is optimum for user's intention can be set.

While the above description has been made with reference to the imaging system 100 having a configuration that outputs a reconstructed image via the output unit 110, the imaging system 100 may include an accumulating unit 113 that accumulates the digital signal of an image captured by the imaging apparatus 20 and the multiple sampling information used during the image capturing without reconstructing the image. When some of the digital signals are removed to further compress the accumulated data, the data to be removed is selected using the color correlation information determined by the color correlation determination unit 112. Thus, the compression ratio can be increased without significantly decreasing the image quality. Such a process is described below.

Figure 26:
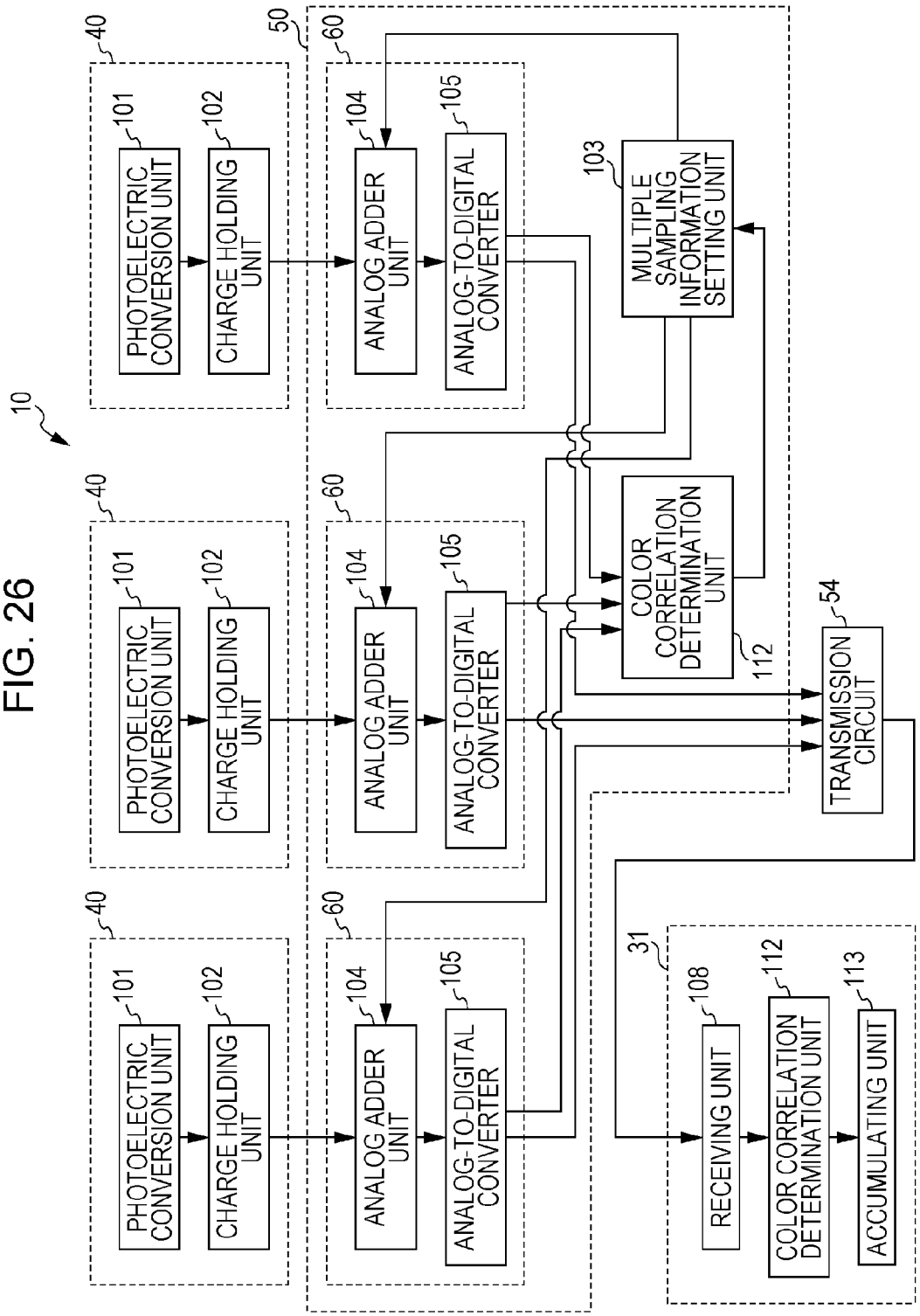
FIG. 26 is a block diagram of the configuration of a decoding apparatus of the imaging system according to a modification.
Figure 27:
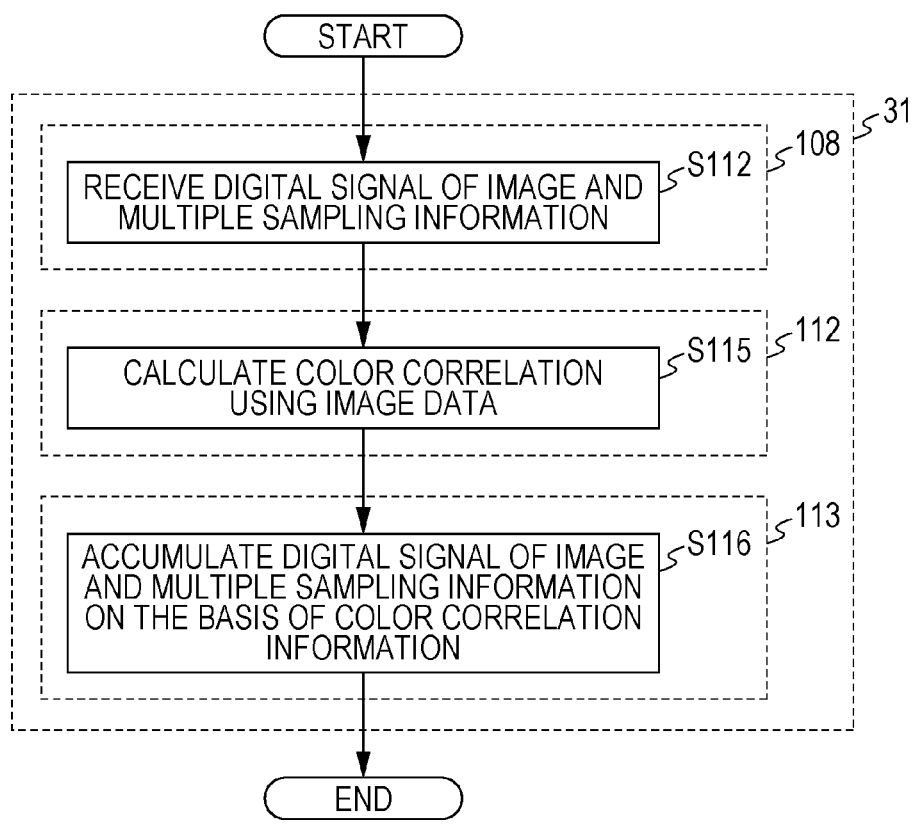
FIG. 27 is a flowchart illustrating the procedure for the main process performed by the decoding apparatus.

FIG. 26 is a block diagram of the configuration of a decoding apparatus 31 of the imaging system 100 according to a modification. FIG. 27 is a flowchart illustrating the procedure for the main process performed by the decoding apparatus 31. The decoding apparatus 31 according to the present exemplary embodiment includes the receiving unit 108, a color correlation determination unit 112, and the accumulating unit 113.

The receiving unit 108 receives the digital signal of an image sent from the transmission circuit 54 and the multiple sampling information used during image capturing (step S112).

The color correlation determination unit 112 calculates the color correlation of the image being captured (step S115). This process can be performed as that in step S106.

Figure 5G:
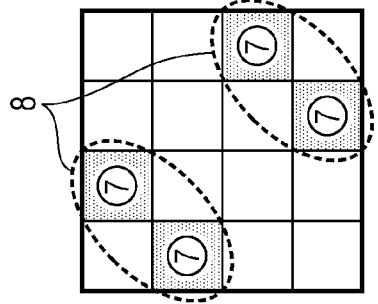
Figure 5F:
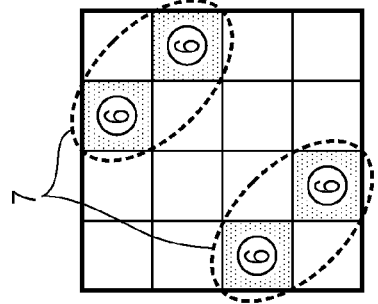
Figure 5E:
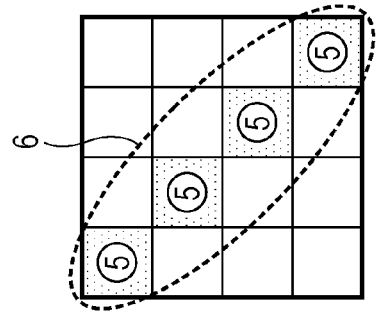
Figure 6D:
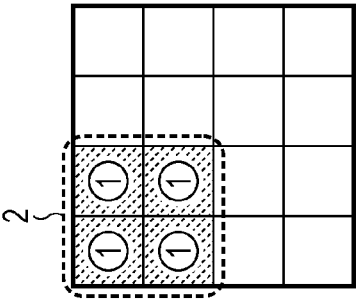
FIGS. 6A to 6H illustrate which pixels provide charge signals to be summed in order to obtain each of eight digital signals for a G image (not an R image) at t=1.
Figure 6C:
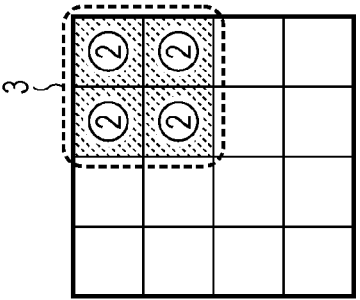
Figure 6B:
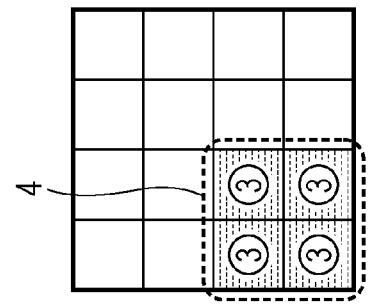
Figure 6A:
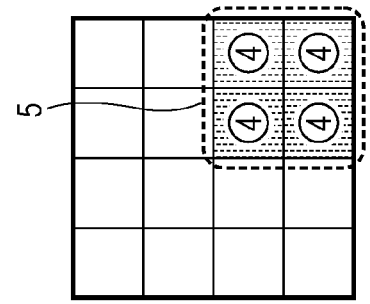
Figure 6H:
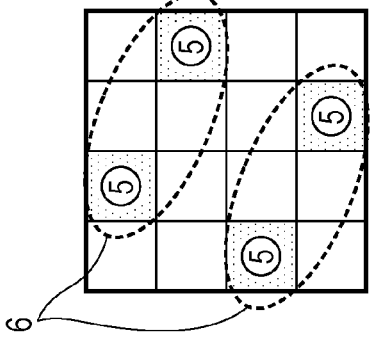
Figure 6G:
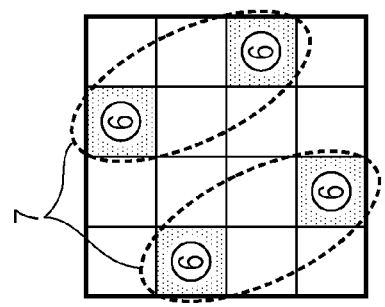
Figure 6F:
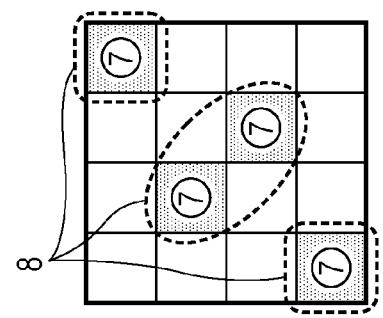
Figure 6E:
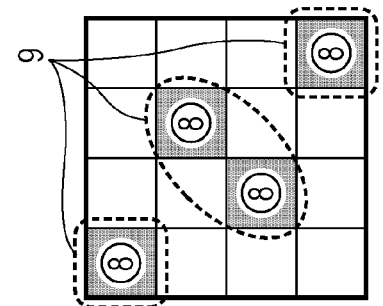
Figure 7D:
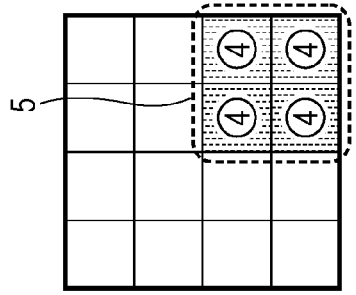
FIGS. 7A to 7H illustrate which pixels provide charge signals to be summed in order to obtain each of eight digital signals for a B image at t=1.
Figure 7C:
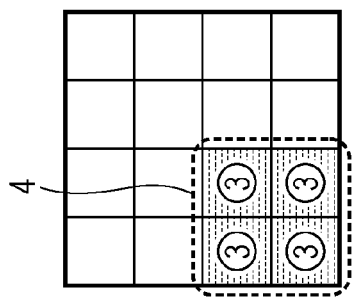
Figure 7B:
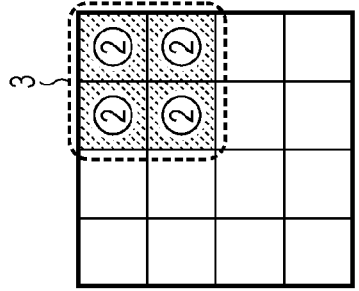
Figure 7A:
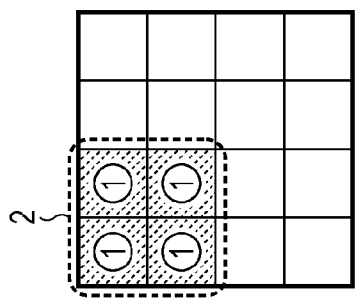
Figure 7H:
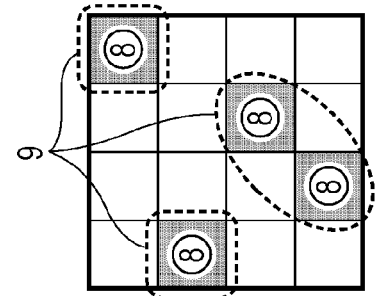
Figure 7G:
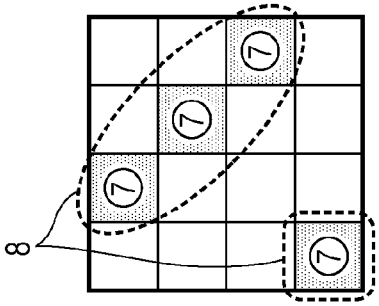
Figure 7F:
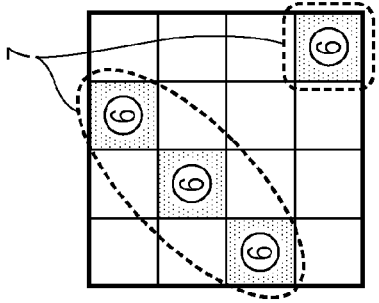
Figure 7E:
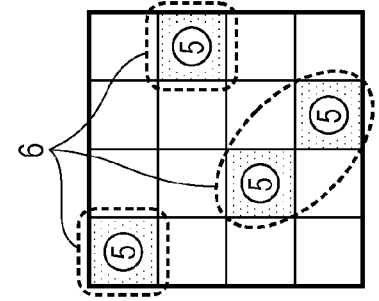
Figure 28:
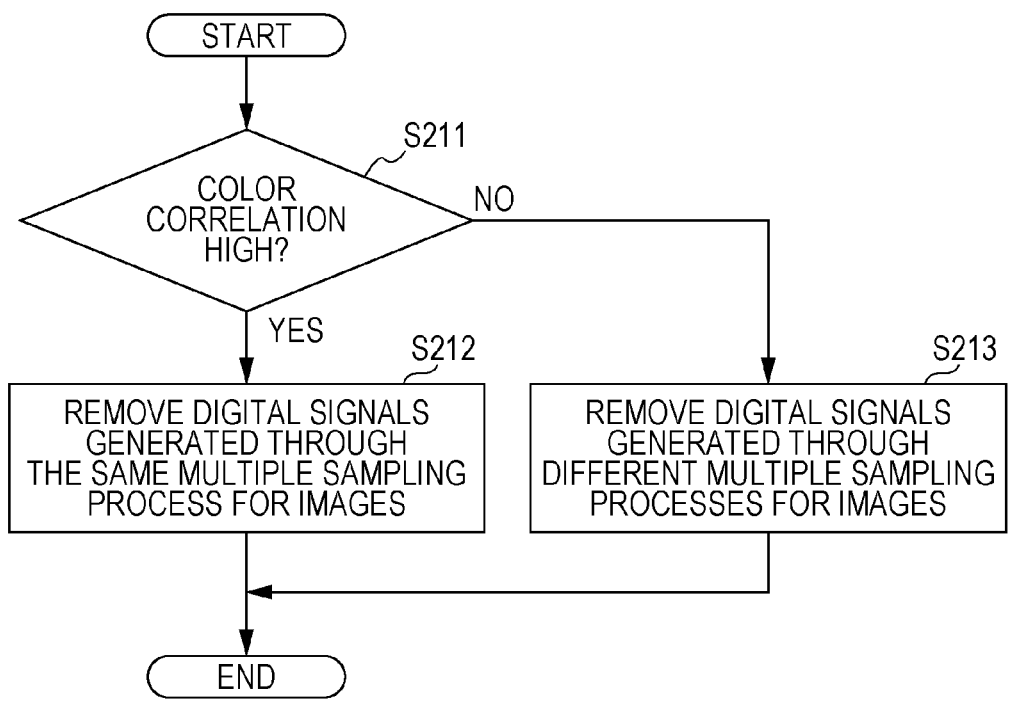
FIG. 28 is a flowchart illustrating the procedure for the main process performed by an accumulating unit.

The accumulating unit 113 accumulates the digital signal of the image captured by the imaging apparatus 20 and the multiple sampling information used during the image capturing by using the result of estimation made by the color correlation determination unit 112 (step S116). FIG. 28 is a flowchart illustrating the procedure for the main process performed by the accumulating unit 113. The accumulating unit 113 determines whether a color correlation exists in the subject using the result of estimation made by the color correlation determination unit 112 (step S211). The color correlation determination unit 112 performs a process that is similar to the above-described process performed by the color correlation determination unit 106 to calculate the color correlation value of the subject. If the color correlation value is higher than or equal to a threshold value (Yes in step S211), it is determined that a color correlation exists in the subject and, thus, the digital signals generated through the same multiple sampling for the R image, the G image, and the B image are removed. In this manner, the data compression ratio can be increased (step S212). For example, this process is performed as follows. That is, if multiple sampling for the R image is set to that illustrated in FIGS. 5A to 5H, multiple sampling for the G image is set to that illustrated in FIGS. 16A to 16H, and multiple sampling for the B image is set to that illustrated in FIGS. 17A to 17H, the digital signals corresponding to FIGS. 5F, 16F, and 17F are removed, and remaining seven digital signals for each of R, G, and B are accumulated. However, if the color correlation value is lower than the threshold value (No in step S211), it is estimated that a color correlation may not exist in the subject and, thus, the digital signals generated through different multiple samplings for the R image, the G image, and the B image are removed. In this manner, the data compression ratio can be increased (step S213). For example, this process is performed as follows. That is, if multiple sampling for the R image is set to that illustrated in FIGS. 5A to 5H, multiple sampling for the G image is set to that illustrated in FIGS. 16A to 16H, and multiple sampling for the B image is set to that illustrated in FIGS. 17A to 17H, the digital signals corresponding to FIGS. 5G, 16G, and 17G are removed, and remaining seven digital signals for each of R, G, and B are accumulated. The accumulated data can be stored in a recording medium, such as an SD card or a hard disk.

As described above, according to the present exemplary embodiment, if the color correlation determination unit 112 determines that a color correlation exists in the subject, the imaging system accumulates the digital signals so that the percent of the multiple sampling information that differs among the R image, the G image, and the B image increases.

Thus, a decrease in the image quality can be prevented. However, if the color correlation determination unit 112 determines that no color correlation exists in the subject, the imaging system accumulates the digital signals so that the percent of the multiple sampling information that differs among the R image, the G image, and the B image decreases. Thus, degradation of an image quality presented to the eyes caused by color shift can be prevented. In this manner, the digital signals that are optimum to the subject can be accumulated and, thus, the image quality of the reconstructed image can be improved while increasing the compression ratio. Accordingly, the captured image can be held in a small memory area and, thus, the imaging system is effective for, for example, security cameras.

While the above description has been made with reference to the multiple sampling process that generate 8 digital signals from 16 (4-by-4) pixels, the number of the generated digital signals is not limited to 8. The number of the generated digital signals may be any number greater than or equal to 2.

FIGS. 29A and 29B, FIGS. 30A and 30B, and FIGS. 31A and 31B are schematic illustrations illustrating the multiple sampling processes performed for the R image, the G image, and the B image when two digital signals are output from 16 (4-by-4) pixels. Note that for simplicity, a dotted line surrounding each of the readout pixel groups as illustrated in FIGS. 5A to 5H is not illustrated in FIGS. 29A and 29B, FIGS. 30A and 30B, FIGS. 31A and 31B, FIGS. 32A to 32D, FIGS. 33A to 33D, FIGS. 34A to 34D, FIGS. 35A to 35D, FIGS. 36A to 36D, and FIGS. 37A to 37D. The pixels with circled numbers form a readout pixel group. The readout pixel groups are identified by reference numerals 301 and 302 or reference numerals 303 to 306.

Figure 29A:
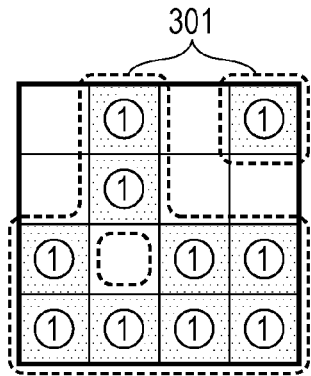
FIGS. 29A and 29B are schematic illustrations of the multiple sampling process performed for the R image when two digital signals are output from 4-by-4 (16) pixels.
Figure 29B:
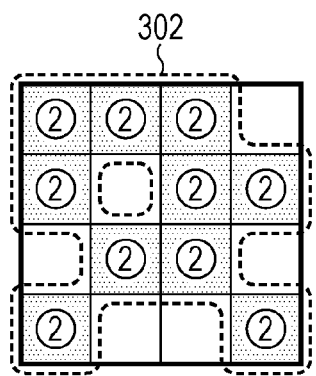
Figure 30A:
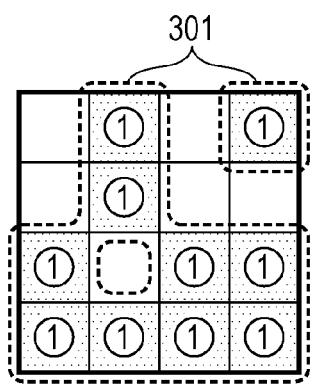
FIGS. 30A and 30B are schematic illustrations of the multiple sampling process performed for the G image when two digital signals are output from 4-by-4 (16) pixels.
Figure 30B:
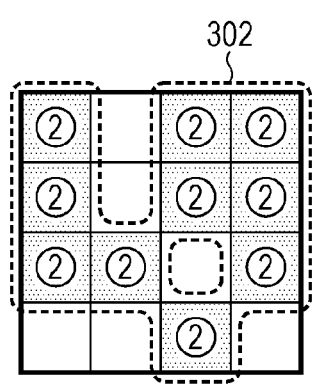
Figure 31A:
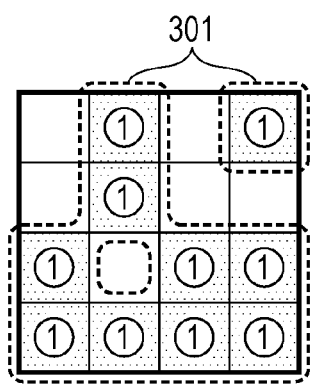
FIGS. 31A and 31B are schematic illustrations of the multiple sampling process performed for the B image when two digital signals are output from 4-by-4 (16) pixels.
Figure 31B:
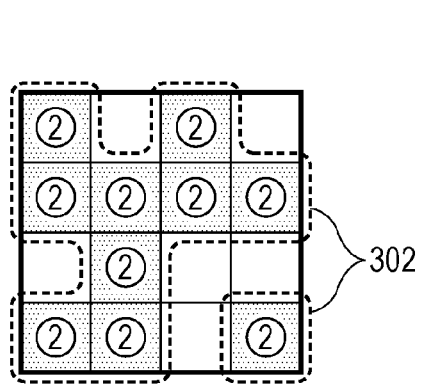
Figure 35A:
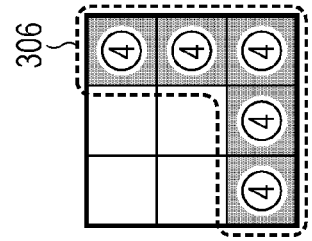
FIGS. 35A to 35D are schematic illustrations of an multiple sampling process performed for the R image when four digital signals are output from 3-by-3 (9) pixels.
Figure 35B:
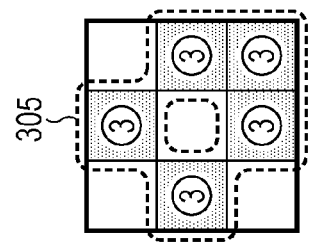
Figure 35C:
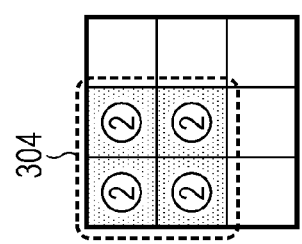
Figure 35D:
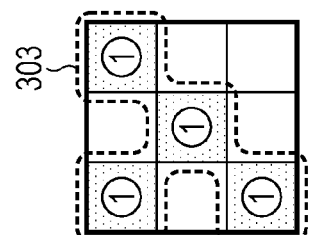
Figure 36D:
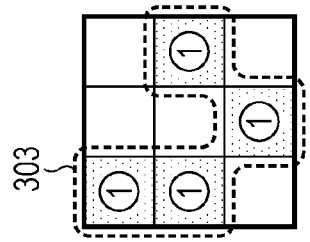
FIGS. 36A to 36D are schematic illustrations of the multiple sampling process performed for the G image when four digital signals are output from 3-by-3 (9) pixels.
Figure 36C:
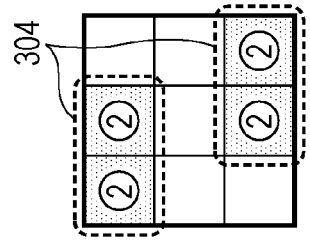
Figure 36B:
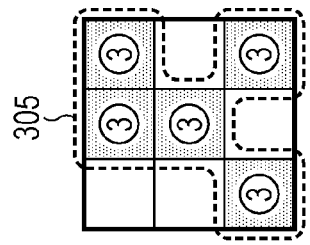
Figure 36A:
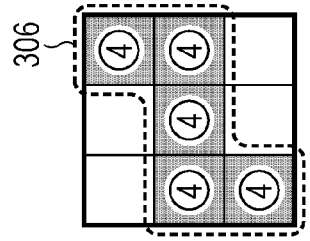

FIGS. 29A and 29B illustrate which pixels output the charge signals to be summed in order to generate each of two digital signals of the R image at t=1. That is, the pixels with numbers assigned thereto in each of FIGS. 29A and 29B are used in the multiple sampling process. By summing the charge signals of the pixels, the digital signal is generated. In FIGS. 29A and 29B, the readout pixel groups 301 and 302 are also illustrated. In multiple, FIGS. 30A and 30B illustrate which pixels output the charge signals to be summed in order to generate each of two digital signals of the G image (not the R image) at t=1. Furthermore, FIGS. 31A and 31B illustrate which pixels output the charge signals to be summed in order to generate each of two digital signals of the B image at t=1. As in FIGS. 5A to 5D, FIGS. 6A to 6D, and FIGS. 7A to 7D, the positions of the readout pixel group 301 in FIGS. 29A, 30A, and 31A are the same in the R image, the G image, and the B image. In contrast, as in FIGS. 5E to 5H, FIGS. 6E to 6H, and FIGS. 7E to 7H, the positions of the readout pixel group 302 in FIGS. 29B, 30B, and 31B differ from one another in the R image, the G image, and the B image. As described above, sampling is performed so that the multiple sampling patterns are not the same in the R image, the G image, and the B image as a whole. In this manner, the image quality of a reconstructed image is improved.

FIGS. 32A to 32D, FIGS. 33A to 33D, and FIGS. 34A to 34D are schematic illustrations of the multiple sampling process performed for the R image, the G image, and the B image, respectively, when four digital signals are output from 4-by-4 (16) pixels.

FIGS. 32A to 32D illustrate which pixels output the charge signals to be summed in order to generate the four digital signals of the R image at t=1. That is, in each of FIGS. 32A to 32D, the pixels with numbers indicate the pixels used for the multiple sampling process. By summing the charge signals output from these pixels, the digital signals are generated. In FIGS. 32A to 32D, readout pixel groups 303 to 306 are illustrated. In multiple, FIGS. 33A to 33D illustrate which pixels output the charge signals to be summed in order to generate the four digital signals of the G image (not the R image) at t=1. Furthermore, FIGS. 34A to 34D illustrate which pixels output the charge signals to be summed in order to generate the four digital signals of the B image at t=1. As in FIGS. 5E to 5H, FIGS. 6E to 6H, and FIGS. 7E to 7H, the positions of the readout pixel groups 303 to 306 in FIGS. 32A to 32D, FIGS. 33A to 33D, and FIGS. 34A to 34D differ from one another in the R image, the G image, and the B image. That is, in each of the R image, the G image, and the B image, a digital signal that samples a pixel at the same position is not present. However, in each of FIGS. 32A to 32D, FIGS. 33A to 33D, and FIGS. 34A to 34D, if the four digital signals are summed, the resultant value is twice the total sum of the pixel values of the 16 pixels. Accordingly, the color correlation determination unit 106 determines that the color correlation of the target block is high if the following conditions are satisfied:

$$\frac{\left|\sum_{i \in A} (Ra_i - \overline{Ra})(Ga_i - \overline{Ga})\right|}{\sqrt{\sum_{i \in A} (Ra_i - \overline{Ra})^2} \sqrt{\sum_{i \in A} (Ga_i - \overline{Ga})^2}} \geq Th_{IC} \text{ and}$$

$$\frac{\left|\sum_{i \in A} (Ra_i - \overline{Ra})(Ba_i - \overline{Ba})\right|}{\sqrt{\sum_{i \in A} (Ra_i - \overline{Ra})^2} \sqrt{\sum_{i \in A} (Ba_i - \overline{Ba})^2}} \geq Th_{IC} \text{ and}$$

$$\frac{\left|\sum_{i \in A} (Ga_i - \overline{Ga})(Ba_i - \overline{Ba})\right|}{\sqrt{\sum_{i \in A} (Ga_i - \overline{Ga})^2} \sqrt{\sum_{i \in A} (Ba_i - \overline{Ba})^2}} Th_{IC}.$$

where $Ra_i$ denotes a first digital signal of the R image in a target block i, $Ga_i$ denotes a first digital signal of the G image, $Ba_i$ denotes a first digital signal of the B image, "A" denotes an adjacent block, and Ra, Ga, Ba with an upper bar denote the average signals given as follows:

$$\overline{Ra} = \frac{1}{\text{Num}(A)} \sum_{i \in A} (Ra_i), \overline{Ga} = \frac{1}{\text{Num}(A)} \sum_{i \in A} (Ga_i),$$

$$\overline{Ba} = \frac{1}{\text{Num}(A)} \sum_{i \in A} (Ba_i).$$

where Num(A) denotes the number of blocks included in the adjacent region A.

By performing the multiple sampling process in this manner, that is, by changing the number of the digital signals output from the analog adder unit 104, the number of data input to the ADC 14 can be changed. Although the load imposed on the ADC 14 can be reduced by reducing the number of output data, the image quality of the image reconstructed by the image reconstruction unit 109 deteriorates. In contrast, by increasing the number of output data, the image quality of the image reconstructed by the image reconstruction unit 109 is improved, although the load imposed on the ADC 14 increases.

While the above description has been made with reference to the multiple sampling process, that is, the analog multiple process performed for each of blocks of 4-by-4 (16) pixels, the size of the block to be processed is not limited to 16 pixels. For example, the size of the block may be 3-by-3 (9) pixels or 8-by-8 (64) pixels. FIGS. 35A to 35D, FIGS. 36A to 36D, and FIGS. 37A to 37D are schematic illustrations of the multiple sampling processes performed for the R image, the G image, and the B image, respectively, when four digital signals are output from 3-by-3 (9) pixels. In FIGS. 35A to 35D, FIGS. 36A to 36D, and FIGS. 37A to 37D, since the multiple sampling process and the process performed by the color correlation determination unit 106 are similar to those illustrated in FIGS. 32A to 32D, FIGS. 33A to 33D, and FIGS. 34A to 34D, descriptions are not repeated.

In the above-described present exemplary embodiment, M (M=2, 4, 8) pixels groups having different pixel arrangement patterns are selected from among N-by-N pixels (N=3, 4), and the multiple sampling information for identifying each of the pixel groups is set. However, the present exemplary embodiment is only an example of the present disclosure. Various changes and modifications are apparent to those skilled in the art.

For example, a plurality of pixel groups identified by the multiple sampling information need not be selected from among N-by-N pixels, but can be selected from among P-by-Q pixels (P, Q: an integer greater than or equal to 2, P=Q or P # Q). N-by-N pixels are an example of pixels in the case where P=Q. If, in the image sensing device 11, the common divisors of the numbers of pixels in the horizontal direction and vertical direction of the pixel group that forms a light receiving area are set as P and Q, the compressed sensing can be efficiently performed. Note that at that time, P need not be equal to Q. Note that the term "pixel group that forms a light receiving area" implies that a pixel group that does not form the light receiving area is present in the pixel groups included in the image sensing device 11. For example, a pixel group in the peripheral region of the rectangular image sensing device 11 may serve as an optical black pixels and, thus, may not form the light receiving area.

In multiple, the number of pixel groups selected from among P×Q needs to be greater than or equal to 2 and less than P×Q. This is because if the number of pixel groups is less than P×Q, the compressed sensing can be performed. Unlike the above-described exemplary embodiment, the number of the selected pixel groups is not limited to 2, 4, and 8.

While the above description has been made with reference to P and Q each of which is an integer greater than or equal to 2, a structure including a pixel group of 1-by-L or L-by-1 pixels (L: an integer greater than or equal to 4) may be employed as another example. In such a case, the number of pixel groups selected from among L pixel groups is greater than or equal to 2 and less than L. Since a CMOS image sensor reads data line by line, the above-described process that reads data on a line basis is relatively efficient.

Note that the imaging apparatus of the present disclosure need not be realized as an actual apparatus. For example, the operation performed by the above-described imaging apparatus may be provided by a general-purpose processor serving as a computer that executes a computer program stored in a computer-readable recording medium. Such a computer program includes an instruction set that causes the computer to perform the process indicated by, for example, the flowchart illustrated in FIG. 11. The computer program is recorded in a recording medium, such as a compact disc read only memory (CD-ROM), and is distributed in the market. Alternatively, the computer program is transferred via a telecommunications network, such as the Internet.

The imaging system according to the present disclosure is effective for improving the image quality in an imaging apparatus capable of acquiring color information using the compressed sensing which can provide low power consumption, high S/N ratio, and reduced transmission band.

What is claimed is:

1. An imaging system comprising:
an acquirer that receives light rays in a plurality of wavelength bands and acquires charge signals in each of the wavelength bands;
an encoder that performs a multiple sampling process on the charge signals in each of the wavelength bands and encodes image information; and
a decoder that decodes the image information encoded by the encoder;
wherein in the multiple sampling process, the charge signals of a pixel group having a predetermined arrangement pattern are analog-summed and the sum is converted into a digital signal representing a new signal,
wherein the encoder includes a setter that sets up multiple sampling information for identifying at least two pixel groups each to be subjected to the multiple sampling process, the at least two pixel groups include a first pixel group having a first arrangement pattern and a second pixel group having a second arrangement pattern part of which is overlapped with the first arrangement pattern, and combinations of the first arrangement pattern and the second arrangement pattern for all the wavelength bands differ from one another,
wherein the encoder further includes a multiple sampler that performs the multiple sampling process on the charge signals in each of the wavelength bands in accordance with the multiple sampling information and outputs digital image signals in the wavelength band, and
wherein the decoder includes an image reconstructor that generates a reconstructed image from the digital image signals in the wavelength bands using the multiple sampling information and an outputter that outputs the reconstructed image generated by the image reconstructor.

2. The imaging system according to claim 1, further comprising:
a color correlation determiner that receives the digital image signals in each of the wavelength bands, calculates a color correlation among the signals in the wavelength bands, and determines the existence of color correlation among the digital image signals,
wherein the setter sets the multiple sampling information using a result of the determination regarding a color correlation made by the color correlation determiner.

3. The imaging system according to claim 1, wherein the image reconstructor reconstructs an image so that local similarity of the image indicated by the digital image signals in each of the wavelength bands becomes high.

4. An imaging apparatus comprising:
an acquirer that receives light rays in a plurality of wavelength bands and acquires charge signals in each of the wavelength bands; and
an encoder that performs an multiple sampling process on the charge signals in the wavelength bands and encodes image information,
wherein in the multiple sampling process, the charge signals of a pixel group having a predetermined arrangement pattern are analog-summed and the sum is converted into a digital signal representing a new signal,
wherein the encoder includes a setter that sets up multiple sampling information for identifying at least two pixel groups to be subjected to the multiple sampling process, the at least two pixel groups include a first pixel group having a first arrangement pattern and a second pixel group having a second arrangement pattern part of which is overlapped with the first arrangement pattern under a predetermined condition, and combinations of the first arrangement pattern and the second arrangement pattern for all the wavelength bands differ from one another, and
wherein the encoder further includes a multiple sampler that performs the multiple sampling process on the charge signals in each of the wavelength bands in accordance with the multiple sampling information and outputs image signals in each of the wavelength bands.

5. The imaging apparatus according to claim 4, wherein the acquirer receives light rays in first, second, and third wavelength bands representing the plurality of wavelength bands and acquires analog charge signals in each of the first, second, and third wavelengths,
wherein the multiple sampler of the encoder includes an adder that performs an analog multiple process on the analog charge signals in each of the wavelength bands in accordance with the multiple sampling information and generates an analog multiple signal in each of the wavelength bands, and
wherein the multiple sampler further includes a converter that converts the analog multiple signal in each of the wavelength bands into a digital image signal in the wavelength band.

6. The imaging apparatus according to claim 4, further comprising:
a color correlation determiner that receives an image signal in each of the wavelength bands output from the multiple sampler and determines the existence of color correlation among the image signals,
wherein the setter sets, as the predetermined condition, the multiple sampling information using a result of the determination regarding a color correlation made by the color correlation determiner.

7. The imaging apparatus according to claim 6, wherein the multiple sampling process performed on the charge signals in each of the wavelength bands on the basis of the multiple sampling information includes a first multiple sampling process using the charge signals at pixel positions that are common to the charge signals in all the wavelength bands and a second multiple sampling process using the charge signals at pixel positions that are not common to the charge signals in all the wavelength bands, and
wherein the color correlation determiner determines the existence of a color correlation among the image signals using image signals in the wavelength bands output from the first multiple sampling process performed on charge signals in the wavelength bands.

8. The imaging apparatus according to claim 6, wherein the setter sets the multiple sampling information so that a difference ratio of the multiple sampling process is relatively high among the image signals in the wavelength bands if the result of determination regarding a color correlation made by the color correlation determiner meets a predetermined standard, and
wherein the setter sets the multiple sampling information so that a difference ratio of the multiple sampling process is relatively low among the image signals in the wavelength bands if the result of determination regarding color correlation made by the color correlation determiner does not meet the predetermined standard.

9. The imaging apparatus according to claim 6, wherein the acquirer acquires first, second, and third image signals representing image signals in the first, second, and third wavelength bands, respectively,
  wherein the color correlation determiner calculates a color correlation value among the first, second, and third image signals, and
  wherein the setter sets the multiple sampling information regarding the first image signal and the multiple sampling information regarding the second image signal so that the multiple sampling process performed on the first image signal differs from the multiple sampling process performed on the second image signal if the color correlation value meets a predetermined standard.

10. The imaging apparatus according to claim 6, wherein a plurality of pieces of the multiple sampling information are provided in advance, and
  wherein the setter selects, from among the pieces of the multiple sampling information, a piece of the multiple sampling information corresponding to the multiple sampling process to be performed on the first image signal and a piece of the multiple sampling information corresponding to the multiple sampling process to be performed on the second image signal in accordance with a magnitude of the color correlation value.

11. The imaging apparatus according to claim 9, wherein the setter sets the multiple sampling information so that a level of difference between the multiple sampling process performed on the first image signal and the multiple sampling process performed on the second signal is relatively high.

12. The imaging apparatus according to claim 6, wherein the acquirer acquires first, second, and third image signals representing image signals in the first, second, and third wavelength bands, respectively,
  wherein the color correlation determiner calculates the color correlation value among the first, second, and third image signals, and
  wherein if the color correlation value does not meet a predetermined standard, the setter sets the multiple sampling information regarding each of the first, second, and third image signals so that the multiple sampling processes performed on the first, second, and third image signals are the same.

13. The imaging apparatus according to claim 4, wherein the acquirer receives light rays in blue, green, and red wavelength bands serving as light rays in first, second, and third wavelength bands and acquires analog charge signals in each of the red, green, and blue wavelength bands.

14. The imaging apparatus according to claim 13, wherein the acquirer includes three image sensing devices that generate the charge signals in the red, green, and blue wavelength bands.

15. The imaging apparatus according to claim 4, wherein the acquirer receives light rays in cyan, magenta, and yellow wavelength bands serving as light rays in first, second, and third wavelength bands, respectively, and acquires analog charge signals in each of the cyan, magenta, and yellow wavelength bands.

16. The imaging apparatus according to claim 4, wherein the acquirer receives light rays in a plurality of wavelength bands whose exposure times differ from one another and acquires analog charge signals in each of the wavelength bands.

17. The imaging apparatus according to claim 4, wherein the acquirer receives light rays in four or more wavelength bands and acquires analog charge signals in each of the wavelength bands.

18. The imaging apparatus according to claim 4, wherein the setter sets the multiple sampling information for identifying each of the at least two pixel groups from among P×Q pixels, where each of P and Q is an integer greater than or equal to 2,
  and wherein the multiple sampler performs the multiple sampling process on the charge signals in the at least two pixel groups identified by the multiple sampling information for each of the wavelength bands and outputs less than P×Q image signals in the wavelength band.

19. The imaging apparatus according to claim 4, wherein the setter sets the multiple sampling information for identifying each of the at least two pixel groups from among L×1 pixels or 1×L pixels, where L is an integer greater than or equal to 4,
  and wherein the multiple sampler performs the multiple sampling process on the charge signals in each of the at least two the pixel groups identified by the multiple sampling information for each of the wavelength bands and outputs less than L image signals in the wavelength bands.

20. An imaging method comprising:
  receiving light rays in a plurality of wavelength bands and acquiring charge signals in each of the wavelength bands; and
  performing an multiple sampling process on the charge signals in the wavelength bands and encoding image information,
  wherein in the multiple sampling process, the charge signals of a pixel group having a predetermined arrangement pattern are analog-summed and the sum is converted into a digital signal representing a new signal,
  wherein the encoding image information includes setting up multiple sampling information for identifying at least two pixel groups subjected to the multiple sampling process, the at least two pixel groups includes a first pixel group having a first arrangement pattern and a second pixel group having a second arrangement pattern part of which is overlapped with the first arrangement pattern under a predetermined condition, and combinations of the first arrangement pattern and the second arrangement pattern for all the wavelength bands differ from one another, and
  wherein the encoding image information further includes performing the multiple sampling process on the charge signals in each of the wavelength bands in accordance with the multiple sampling information and outputting image signals in each of the wavelength bands.

21. An imaging apparatus comprising:
  a first acquirer having a first plurality of pixels including a first pixel, the first plurality of pixels receiving a first wavelength band light ray of a light ray including the first wavelength band light ray and a second wavelength band light ray and outputting a first plurality of pixel values including a first pixel value of the first pixel;
  a second acquirer having a second plurality of pixels including a second pixel, the second plurality of pixels receiving the second wavelength band light ray and outputting a second plurality of pixel values including a second pixel value of the second pixel;
  a first adder that outputs a first multiple signal obtained by summing the first pixel value and a third plurality of pixel values provided by a third plurality of pixels and outputs a second multiple signal obtained by summing the first pixel value and a fourth plurality of pixel values provided by a fourth plurality of pixels;

a first converter that converts the first multiple signal into a first digital signal and converts the second multiple signal into a second digital signal;

a second adder that outputs a third multiple signal obtained by summing the second pixel value and a fifth plurality of pixel values provided by a fifth plurality of pixels and outputs a fourth multiple signal obtained by summing the second pixel value and a sixth plurality of pixel values provided by a sixth plurality of pixels; and a second converter that converts the third multiple signal into a third digital signal and converts the fourth multiple signal into a fourth digital signal, wherein the first plurality of pixels include the third plurality of pixels and the fourth plurality of pixels, wherein the first plurality of pixel values include the third plurality of pixel values and the fourth plurality of pixel values, wherein, in the first acquirer, at least one pixel included in the third plurality of pixels differs from at least one pixel included in the fourth plurality of pixels, wherein the second plurality of pixels include the fifth plurality of pixels and the sixth plurality of pixels, wherein the second plurality of pixel values include the fifth plurality of pixel values and the sixth plurality of pixel values, wherein, in the second acquirer, at least one pixel included in the fifth plurality of pixels differs from at least one pixel included in the sixth plurality of pixels, wherein physical locations of the first pixel and the third plurality of pixels in the first acquirer and physical locations of the second pixel and the fifth plurality of pixels in the second acquirer have a first one-to-one relationship, wherein physical locations of the first pixel and the fourth plurality of pixels in the first acquirer and physical locations of the second pixel and the sixth plurality of pixels in the second acquirer have a second one-to-one relationship, and wherein the first one-to-one relationship differs from the second one-to-one relationship.

* * * * *